(12) United States Patent
Kim et al.

(10) Patent No.: US 10,249,798 B2
(45) Date of Patent: Apr. 2, 2019

(54) LIGHT EMITTING DEVICE

(71) Applicant: Seoul Viosys Co., Ltd., Ansan-si (KR)

(72) Inventors: Chang Yeon Kim, Ansan-si (KR); Sung Su Son, Ansan-si (KR); Joon Sup Lee, Ansan-si (KR); Jong Hyeon Chae, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/244,744

(22) Filed: Aug. 23, 2016

(65) Prior Publication Data

US 2016/0365486 A1 Dec. 15, 2016

Related U.S. Application Data

(63) Continuation of application No. PCT/KR2015/012153, filed on Nov. 12, 2015.

(30) Foreign Application Priority Data

| Nov. 12, 2014 | (KR) | 10-2014-0156839 |
| Dec. 12, 2014 | (KR) | 10-2014-0179554 |
| Feb. 12, 2015 | (KR) | 10-2015-0021888 |

(51) Int. Cl.
*H01L 33/38* (2010.01)
*H01L 33/48* (2010.01)
(Continued)

(52) U.S. Cl.
CPC ........... *H01L 33/382* (2013.01); *H01L 33/06* (2013.01); *H01L 33/24* (2013.01); *H01L 33/486* (2013.01);
(Continued)

(58) Field of Classification Search
None
See application file for complete search history.

(56) References Cited

U.S. PATENT DOCUMENTS 9,543,488 B2 * 1/2017 Chae .............. H01L 33/62
2009/0283787 A1 * 11/2009 Donofrio ........... H01L 33/405
257/98

(Continued)

FOREIGN PATENT DOCUMENTS

| JP | 2014-179469 | 9/2014 |
| KR | 10-1362081 | 2/2014 |
| KR | 101362081 B1 * | 2/2014 |

OTHER PUBLICATIONS

International Search Report dated Feb. 26, 2016 in International Application No. PCT/KR2015/012153.

*Primary Examiner* — Walter H Swanson
*Assistant Examiner* — Kien C Ly
(74) *Attorney, Agent, or Firm* — H.C. Park & Associates, PLC

(57) ABSTRACT

A light emitting device includes a light emitting structure including a support structure including a first bulk electrode a second bulk electrode disposed on and electrically connected to the first electrode and the second electrode, respectively. A substrate is disposed adjacent to the support structure, wherein each of the first and second bulk electrodes includes an upper region and a lower region with the upper regions of the first and second bulk electrodes being separated from each other by a first distance. The substrate includes a first interconnection portion and a second interconnection portion electrically connected to the first bulk electrode and the second bulk electrode, respectively, and separated from each other by a second distance. The second distance is greater than the first distance.

20 Claims, 21 Drawing Sheets

(51) Int. Cl.
*H01L 33/62* (2010.01)
*H01L 33/06* (2010.01)
*H01L 33/24* (2010.01)
H01L 33/00 (2010.01)
H01L 33/64 (2010.01)

(52) U.S. Cl.
CPC .......... *H01L 33/62* (2013.01); *H01L 33/0079* (2013.01); *H01L 33/647* (2013.01); *H01L 2224/16225* (2013.01); *H01L 2933/0016* (2013.01)

(56) References Cited

U.S. PATENT DOCUMENTS

| | | | |
|---|---|---|---|
| 2010/0051972 A1* | 3/2010 | Chen | H01L 25/0753 257/88 |
| 2011/0074026 A1* | 3/2011 | Shim | H01L 21/4846 257/737 |
| 2013/0015483 A1 | 1/2013 | Shimokawa et al. | |
| 2013/0240922 A1* | 9/2013 | Yamamoto | H01L 25/0753 257/89 |
| 2014/0227813 A1 | 8/2014 | Yoneda et al. | |
| 2014/0252390 A1 | 9/2014 | Yoon et al. | |
| 2014/0264413 A1 | 9/2014 | Yamada et al. | |
| 2015/0364665 A1* | 12/2015 | Lopez | H01L 33/382 257/99 |

* cited by examiner

LIGHT EMITTING DEVICE

CROSS-REFERENCE TO RELATED APPLICATIONS

This application is a continuation of International Application No. PCT/KR2015/012153, filed on Nov. 12, 2015, and claims priority from and the benefit of Korean Patent Application No. 10-2014-0156839, filed on Nov. 12, 2014, Korean Patent Application No. 10-2014-00179554, filed on Dec. 12, 2015 and Korean Patent Application No. 10-2015-0021888, filed on Feb. 12, 2015, which are hereby incorporated by reference for all purpose as if fully set forth herein.

BACKGROUND

Field

Exemplary embodiments of the invention relate to a light emitting device, and more particularly, to a light emitting device configured to improve heat dissipation efficiency, electrical characteristics and mechanical stability.

Discussion of the Background

Recently, with an increasing demand for small high-output light emitting devices, the demand for large flip-chip type light emitting devices having good heat dissipation efficiency also is increasing. A flip-chip type light emitting device includes electrodes directly bonded to a secondary substrate and does not require a wire for supplying electric power to the flip-chip type light emitting device from an external power source and thus has much higher heat dissipation efficiency than a lateral type light emitting device. Thus, upon application of high density current, the flip-chip type light emitting device may effectively conduct heat towards the secondary substrate and may be suitably used as a high-output light emitting source.

In addition, to reduce the size and increase the output of a light emitting device, there is increasing demand for a chip scale package in which the light emitting device is used per se as a package by omitting packaging the light emitting device in a separate housing or the like. Particularly, since the electrodes of the flip-chip type light emitting device may provide a function similar to leads of the package, the flip-chip type light emitting device may be suitable as a chip scale package.

When such a chip scale package type device is used as a high-output light emitting device, a high density electric current is applied to the chip scale package. When a high density electric current is applied to the package, the amount of heat generated from the light emitting chip is increased in proportion to the electric current, so that the heat dissipation efficiency of the high-output light emitting device becomes a major factor in determining the reliability of the light emitting device. Therefore, there is a need for a high-output chip scale package that has high heat dissipation efficiency and good mechanical stability to ensure high reliability. Moreover, when the chip scale package is mounted on a board including a conductive circuit via an adhesive material such as solder, pastes, and the like, the adhesive material flows along the electrodes of the chip and the circuit of the board, thereby possibly disconnecting the electrodes and/or causing a short circuit between the electrodes. Therefore, there is a need for a structure having good mechanical and electrical stability so as to prevent short circuiting upon mounting.

SUMMARY

Exemplary embodiments constructed according to the principles of the invention satisfy one or more of the foregoing needs by providing light emitting devices having high heat dissipation efficiency, uniform luminous characteristics, excellent mechanical stability and/or electrical stability and may prevent short circuit between electrodes.

According to a first exemplary embodiment of the invention, a light emitting device includes a light emitting structure including a first conductive type semiconductor layer, a second conductive type semiconductor layer disposed on the first conductive type semiconductor layer, and an active layer disposed between the first conductive type semiconductor layer and the second conductive type semiconductor layer. A first electrode is electrically connected to the first conductive type semiconductor layer, and a second electrode is disposed on and electrically connected to the second conductive type semiconductor layer. A support structure includes a first bulk electrode disposed on and electrically connected to the first electrode. A second bulk electrode is disposed on and electrically connected to the second electrode. The first bulk electrode and the second bulk electrode are separated from each other with an insulation support layer disposed between the first bulk electrode and the second bulk electrode. A substrate is disposed adjacent to the support structure, wherein each of the first and second bulk electrodes includes an upper region and a lower region with the upper regions of the first and second bulk electrodes being separated from each other by a first distance. The substrate includes a first interconnection portion and a second interconnection portion electrically connected to the first bulk electrode and the second bulk electrode, respectively, and separated from each other by a second distance greater than the first distance.

The first bulk electrode may include a first plane facing the second bulk electrode and a second plane disposed opposite the first plane. The second bulk electrode may include a third plane facing the first bulk electrode and a fourth plane disposed opposite the third plane. The first and second bulk electrodes may include a first depression inset from lower edges of the first and third planes, respectively.

The first depression may include a single, substantially planar surface.

The first depression may include a convex or a concave surface.

The first depression may include a plurality of planar surfaces.

Each of the first and second bulk electrodes may include a second depression inset from lower edges of the second and fourth planes, respectively.

The lower regions of the first and second bulk electrodes may be separated from each other by a third distance greater than the first distance between the upper regions.

The first distance between the upper regions may be 100 µm or less.

The third distance between the lower regions may be 250 µm or less.

The lower regions of the first and second bulk electrodes may be separated from each other by a third distance and the second distance between the first and the second interconnection portions may be greater than the third distance between the lower regions.

The first bulk electrode and the second bulk electrode may have a thickness approximately 5 to 20 times greater than the thickness of the first electrode and the second electrode, respectively.

The light emitting device may include a first insulation layer covering a lower surface of the light emitting structure and lower and side surfaces of the second electrode, and disposed between the light emitting structure and the first electrode to insulate the first electrode from the second electrode.

The light emitting device may include a second insulation layer covering a portion of the first electrode.

The substrate may include a base supporting the first interconnection portion and the second interconnection portion, and the substrate may include at least one via-hole formed through the base.

The via-holes may be disposed on the first bulk electrode and the second bulk electrode, respectively.

At least one via-hole may not overlap the first bulk electrode and the second bulk electrode in a vertical direction.

Each of the first and second bulk electrodes may be a monolithic layer.

The light emitting device may include solder material disposed between the first bulk electrode and the first interconnection portion and between the second bulk electrode and the second interconnection portion.

The insulation support layer between the first and second bulk electrodes may prevent the solder material from flowing between and disconnecting the bulk electrodes.

According to the principles of the invention, since the distance between upper regions of first and second bulk electrodes is relatively short, exemplary embodiments of the light emitting device allow heat generated from the light emitting structure to be effectively dissipated through side surfaces of the first and the second bulk electrodes. Accordingly, the risk of the light emitting device cracking or being damage due to heat can be minimized. In addition, since the distance between lower regions of the first and second bulk electrodes is relatively long, it is possible to minimize disconnection of the first and second bulk electrodes by an adhesive material such as solder upon mounting of the first and second bulk electrodes on a substrate. Further, since the distance between a first interconnection portion and a second interconnection portion is relatively long, it is possible to prevent disconnection of the first and second interconnection portions by the adhesive material such as solder upon mounting of the first and second bulk electrodes on a substrate. With this structure, the light emitting device can minimize the risk of short circuits and provide electrical stability.

The foregoing general description and the following detailed description are exemplary and explanatory and are intended to provide further context for and explanation of the claimed subject matter, which is defined solely by the appended claims.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concepts.

DETAILED DESCRIPTION OF THE ILLUSTRATED EMBODIMENTS

Figure 1:
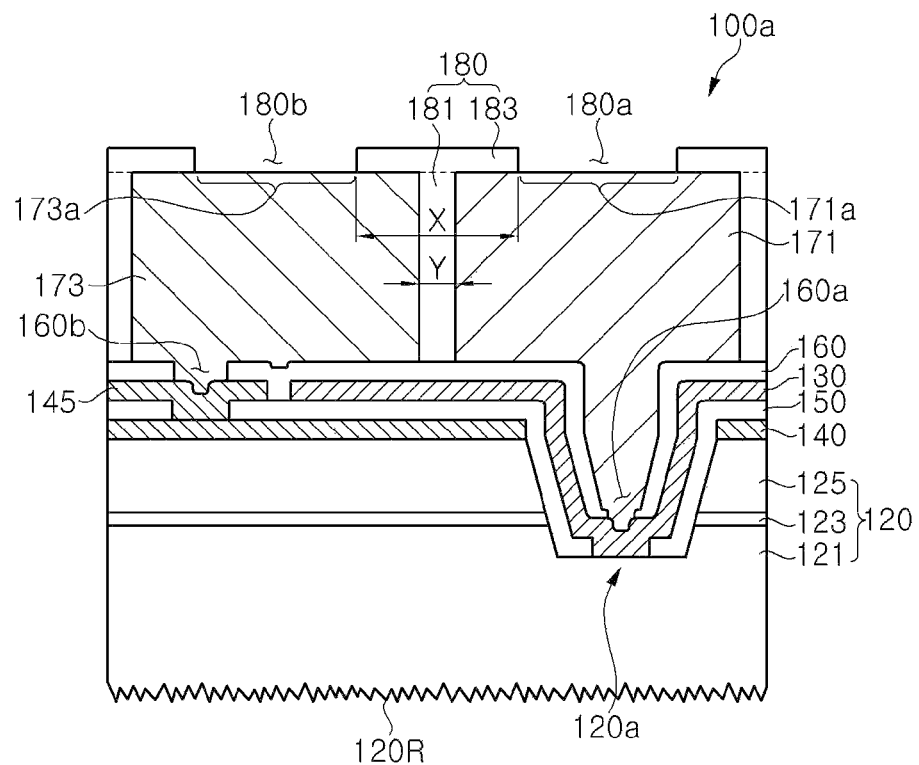
FIGS. 1 and 2 are a sectional view and a plan view, respectively, of a light emitting device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" may encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Now, a light emitting device according to an exemplary embodiment will be described with reference to FIGS. 1 and 2.

Figure 2:
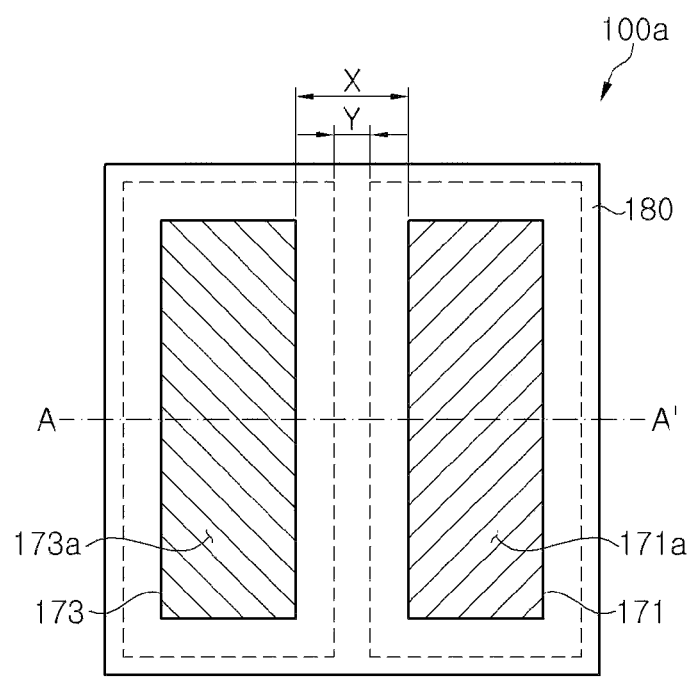

FIGS. 1 and 2 are a sectional view and a plan view, respectively, of a light emitting device according to an exemplary embodiment. FIG. 1 shows a cross-section of the light emitting device taken along line A-A' of FIG. 2.

Referring to FIGS. 1 and 2, a light emitting device 100*a* according to an exemplary embodiment includes a light emitting structure 120, a first contact electrode 130, a second contact electrode 140, insulation layers 150 and 160, first and second bulk electrodes 171 and 173, and an insulation support layer 180. The light emitting device 100*a* may further include a growth substrate (not shown), a wavelength conversion portion (not shown), and a connection electrode 145.

The light emitting structure 120 may include a first conductive type semiconductor layer 121, an active layer 123 disposed on the first conductive type semiconductor layer 121, and a second conductive type semiconductor layer 125 disposed on the active layer 123. The first conductive type semiconductor layer 121, the active layer 123 and the second conductive type semiconductor layer 125 may include a III-V-based compound semiconductor, for example, a nitride-based semiconductor such as (Al, Ga, In)N. The first conductive type semiconductor layer 121 may include n-type dopants (for example, Si), and the second conductive type semiconductor layer 125 may include p-type dopants (for example, Mg), or vice versa. The active layer 123 may include a multi-quantum well (MQW) structure.

The light emitting structure 120 may include a partially exposed region of the first conductive type semiconductor layer 121 formed by partially removing the second conductive type semiconductor layer 125 and the active layer 123. For example, as shown in the drawings, the light emitting structure 120 may include at least one hole 120*a* formed through the second conductive type semiconductor layer 125 and the active layer 123 to expose the first conductive type semiconductor layer 121 therethrough. The light emitting structure 120 may include a plurality of holes 120*a*, and the shape and arrangement of the holes 120*a* are not limited to those shown in the drawings. In some exemplary embodiments, the partially exposed region of the first conductive type semiconductor layer 121 may be provided by partially removing the second conductive type semiconductor layer 125 and the active layer 123 to form a mesa including the second conductive type semiconductor layer 125 and the active layer 123.

The light emitting structure 120 may further include a roughness 120R formed on a lower surface thereof by increasing roughness of the lower surface. The roughness 120R may be formed by at least one of dry etching, wet etching and electrochemical etching. For example, the roughness 120R may be formed by PEC etching or by wet etching in an etching solution containing KOH and NaOH. With the roughness 120R, the light emitting structure may include a convex portion and a concave portion formed in micrometer or nanometer scale on a surface of the first conductive type semiconductor layer 121. With the structure wherein the roughness is formed on the surface of the light emitting structure 120, the light emitting device may achieve improvement in light extraction efficiency.

The light emitting structure 120 may further include a growth substrate (not shown) disposed under the first conductive type semiconductor layer 121. As the growth substrate, any substrate may be used so long as the substrate allows growth of the light emitting structure 120 thereon. For example, the growth substrate may be a sapphire substrate, a silicon carbide substrate, a silicon substrate, a gallium nitride substrate, or an aluminum nitride substrate. Such a growth substrate may be removed from the light emitting structure 120 by a typical method known in the art after fabrication of the light emitting device.

The second contact electrode 140 may be disposed on the second conductive type semiconductor layer 125 to form ohmic contact therewith. In addition, the second contact electrode 140 may cover at least a portion of an upper surface of the second conductive type semiconductor layer 125, and may cover an overall upper surface of the second conductive type semiconductor layer 125. The second contact electrode 140 may be formed as a monolithic layer cover the upper surface of the second conductive type semiconductor layer 125 excluding a region in which the holes 120a of the light emitting structure 120 are formed. With this structure, the light emitting device allows uniform supply of electric current to the entire region of the light emitting structure 120, thereby improving current spreading efficiency. However, it should be understood that the present disclosure is not limited thereto.

The second contact electrode 140 may include a material capable of forming ohmic contact with the second conductive type semiconductor layer 125, for example, a metallic material and/or a conductive oxide.

When the second contact electrode 140 includes the metallic material, the second contact electrode 140 may include a reflective layer and a cover layer covering the reflective layer. As described above, the second contact electrode 140 may reflect light while forming ohmic contact with the second conductive type semiconductor layer 125. Accordingly, the reflective layer may include a metal having high reflectivity and capable of forming ohmic contact with the second conductive type semiconductor layer 125. For example, the reflective layer may include at least one of Ni, Pt, Pd, Rh, W, Ti, Al, Mg, Ag and Au. In addition, the reflective layer may be composed of a single layer or multiple layers.

The cover layer may prevent interdiffusion between the reflective layer and other materials and may prevent external materials from diffusing into and damaging the reflective layer. Accordingly, the cover layer may be formed to cover a lower surface and a side surface of the reflective layer. The cover layer may be electrically connected together with the reflective layer to the second conductive type semiconductor layer 125 to act as an electrode together with the reflective layer. The cover layer may include Au, Ni, Ti, Cr, Pt, or W, and may be composed of a single layer or multiple layers.

When the second contact electrode 140 includes the conductive oxide, the conductive oxide may include ITO, ZnO, AZO, IZO, GZO, and the like. When the second contact electrode 140 includes the conductive oxide, the second contact electrode 140 may cover a larger area of an upper surface of the second conductive type semiconductor layer 125 than when the second contact electrode 140 includes a metal. That is, when the second contact electrode 140 is formed of the conductive oxide, a distance from an upper edge of the hole 120a to the second contact electrode 140 may be shorter than when the second contact electrode 140 is formed of the metallic material. In this exemplary embodiment, the shortest distance from a contact portion between the second contact electrode 140 and the second conductive type semiconductor layer 125 to a contact portion between the first contact electrode 130 and the first conductive type semiconductor layer 121 may be further decreased, whereby forward voltage Vf of the light emitting device 100a may be decreased.

In addition, when the second contact electrode 140 includes ITO, the first insulation layer 150 includes $SiO_2$ and the first contact electrode 130 includes Ag, an omnidirectional reflector having a stack structure of ITO/$SiO_2$/Ag may be formed.

The insulation layers 150 and 160 may include a first insulation layer 150 and a second insulation layer 160. In addition, the insulation layers 150 and 160 may partially cover the first and second contact electrodes 130 and 140. Next, the first insulation layer 150 will be described first and the second insulation layer 160 will be described thereafter.

The first insulation layer 150 may partially cover an upper surface of the light emitting structure 120 and the second contact electrode 140. In addition, the first insulation layer 150 may cover a side surface of the hole 120a while partially exposing the exposed region of the first conductive type semiconductor layer 121 exposed through the hole 120a. The first insulation layer 150 may include an opening disposed corresponding to the hole 120a and an opening exposing a portion of the second contact electrode 140. The first conductive type semiconductor layer 121 and the second contact electrode 140 may be partially exposed through these openings.

The first insulation layer 150 may include an insulating material such as $SiO_2$, $SiN_x$, $MgF_2$, and the like. Furthermore, the first insulation layer 150 may include multiple layers and may include a distributed Bragg reflector wherein materials having different indexes of refraction are alternately stacked one above another. The distributed Bragg reflector may include a structure wherein dielectric layers including at least one of $SiO_2$, $TiO_2$, $ZrO_2$, $HfO_2$, $Nb_2O_5$, and $MgF_2$ are stacked one above another.

When the second contact electrode 140 includes the conductive oxide, the first insulation layer 150 includes the distributed Bragg reflector, thereby improving luminous efficacy of the light emitting device 100a. Alternatively, the second contact electrode 140 may include the conductive oxide and the first insulation layer 150 may be formed of a transparent insulating oxide (for example, $SiO_2$), an omnidirectional reflector having a stack structure of the second contact electrode 140, the first insulation layer 150 and the first contact electrode 130 may be formed.

Although not shown in the drawings, in other exemplary embodiments, the first insulation layer 150 may further cover at least a portion of a side surface of the light emitting structure 120. A degree of covering the side surface of the light emitting structure 120 with the first insulation layer 150 may vary depending upon isolation into unit chips in the process of fabricating a light emitting device. That is, the first insulation layer 150 may be formed to cover only the upper surface of the light emitting structure 120, or otherwise, when the first insulation layer 150 is formed after isolation of the wafer into unit chips in the process of fabricating the light emitting device 100a; thus, not only the upper surface but also the side surface of the light emitting structure 120 may be covered by the first insulation layer 150.

The first contact electrode 130 may partially cover the light emitting structure 120 and may form an ohmic contact with the first conductive type semiconductor layer 121 through the hole 120a and the opening of the first insulation layer 150 disposed corresponding to the hole 120a. The first contact electrode 130 may be formed to cover an overall upper surface of the first insulation layer 150 excluding some region thereof. The first contact electrode 130 may be electrically insulated from the second contact electrode 140 by the first insulation layer 150.

With a structure in which the first contact electrode 130 is formed to cover the majority of the upper surface of the light emitting structure 120 excluding some region thereof, the light emitting device may achieve further improvement in current spreading efficiency. Since a portion of the light emitting structure 120 not covered by the second contact electrode 140 may be covered by the first contact electrode 130, the light emitting device 100a may allow more effective reflection of light, thereby achieving an improvement in luminous efficacy.

The first contact electrode 130 may reflect light while forming an ohmic contact with the first conductive type semiconductor layer 121. Accordingly, the first contact electrode 130 may be composed of a single layer or multiple layers, and may include a highly reflective metal layer such as an Al layer. The highly reflective metal layer may be formed on a bonding layer formed of Ti, Cr or Ni, without being limited thereto. Alternatively, the first contact electrode 130 may include at least one of Ni, Pt, Pd, Rh, W, Ti, Al, Mg, Ag and Au.

Although not shown in the drawings, the first contact electrode 130 may also be formed to cover the side surface of the light emitting structure 120. When the first contact electrode 130 is also formed on the side surface of the light emitting structure 120, the first contact electrode 130 may reflect light, which is emitted to the side surface of the light emitting structure 120 from the active layer 123, in an upward direction, thereby increasing the ratio of light emitted through an upper surface of the light emitting device 100a.

The light emitting device 100a may further include the connection electrode 145.

The connection electrode 145 may be disposed on the second contact electrode 140 and may be electrically connected to the second contact electrode 140 through the opening of the first insulation layer 150. Furthermore, the connection electrode 145 may electrically connect the second contact electrode 140 to a second bulk electrode 173. In addition, the connection electrode 145 may be formed to cover a portion of the first insulation layer 150 and may be separated and insulated from the first contact electrode 130.

An upper surface of the connection electrode 145 may be flush with an upper surface of the first contact electrode 130. The connection electrode 145 and the first contact electrode 130 may be formed by the same process. Accordingly, the connection electrode 145 and the first contact electrode 130 may include the same material, but are not limited thereto. Alternatively, the connection electrode 145 and the first contact electrode 130 may include different materials.

The second insulation layer 160 may partially cover the first contact electrode 130, and may include a first opening 160a which partially exposes the first contact electrode 130 and a second opening 160b which partially exposes the second contact electrode 140. Each of the first and second openings 160a, 160b may be formed singly or in plural.

The second insulation layer 160 may include an insulating material, for example, $SiO_2$, $SiN_x$, $MgF_2$, and the like. Furthermore, the second insulation layer 160 may be composed of multiple layers and may include a distributed Bragg reflector wherein materials having different indexes of refraction are alternately stacked above one another.

The first bulk electrode 171 and the second bulk electrode 173 may be disposed on the light emitting structure 120 and may be electrically connected to the first contact electrode 130 and the second contact electrode 140, respectively. Particularly, the first bulk electrode 171 and the second bulk electrode 173 may be electrically connected to the first and second contact electrodes 130, 140 through direct contact therewith, respectively. Here, the first bulk electrode 171 and the second bulk electrode 173 may be electrically connected to the first and second contact electrodes 130, 140 through the first and second openings 160a, 160b, respectively.

Each of the first bulk electrode 171 and the second bulk electrode 173 may have a thickness of several dozens of micrometers, for example, about 50 μm to about 100 μm, specifically about 70 μm to about 80 μm. Within this thickness range of the first and second bulk electrodes 171 and 173, the light emitting device per se may be used as a chip scale package.

The first bulk electrode 171 and the second bulk electrode 173 may be composed of a single layer or multiple layers and may include an electrically conductive material. Each of the first bulk electrode 171 and the second bulk electrode 173 may include Cu, Pt, Au, Ti, Ni, Al, Ag, and the like. Alternatively, each of the first bulk electrode 171 and the second bulk electrode 173 may include sintered metal particles and a non-metallic material interposed between the metal particles.

A separation distance Y between the first bulk electrode 171 and the second bulk electrode 173 may be a predetermined value or less, which may be a minimum value between electrode pads exposed to a mounting plane of the light emitting device 100a required for mounting the light emitting device 100a on a separate substrate. Specifically, for example, when a certain light emitting device is mounted on a secondary substrate by soldering, the distance between the electrode pads exposed to the mounting plane of the light emitting device generally needs to be about 250 μm or more in order to prevent a short circuit. Alternatively, when the light emitting device is mounted on the secondary substrate by eutectic bonding, the distance between the electrode pads exposed to the mounting plane of the light emitting device generally needs to be about 80 μm or more in order to prevent a short circuit. According to this exemplary embodiment, the separation distance Y between the first bulk electrode 171 and the second bulk electrode 173 may be about 250 μm when soldering, or about 80 μm when eutectic bonding. With the structure wherein the separation distance Y between the first bulk electrode 171 and the second bulk electrode 173 has a predetermined value or less, the first bulk electrode 171 and the second bulk electrode 173 may be formed to have a relatively large horizontal cross-sectional area and volume, thereby allowing effective heat dissipation during operation of the light emitting device 100a. This feature will be described in more detail below.

The first bulk electrode 171 and the second bulk electrode 173 may have different volumes and the horizontal cross-sectional area of the first bulk electrode 171 may be larger than the second bulk electrode 173. In an exemplary embodiment, the first conductive type semiconductor layer 121 may be an n-type semiconductor layer and the second conductive type semiconductor layer 125 may be a p-type semiconductor layer. Generally, heat generated from the light emitting device 100a upon operation is further concentrated on the first bulk electrode 171 acting as an n-type electrode than the second bulk electrode 173 acting as a p-type electrode. Thus, with the structure wherein the horizontal cross-sectional area of the first bulk electrode 171 is larger than the second bulk electrode 173, the light emitting device 100a may achieve an improvement in heat dissipation efficiency. This feature will be described in more detail in other exemplary embodiments described below.

The insulation support layer 180 may be disposed on the light emitting structure 120 and cover side surfaces of the first and second bulk electrodes 171 and 173 and portions of upper surfaces thereof. The insulation support layer 180 may include a third opening 180a and a fourth opening 180b that partially expose the upper surfaces of the first bulk electrode 171 and the second bulk electrode 173, respectively.

The insulation support layer 180 may include a lower insulation support layer 181 and an upper insulation support layer 183, in which the lower insulation support layer 181 may surround the side surfaces of the first and second bulk electrodes 171 and 173 and the upper insulation support layer 183 may partially cover the upper surfaces of the first and second bulk electrodes 171 and 173. The upper insulation support layer 183 may cover interfaces between the lower insulation support layer 181 and the first and second bulk electrodes 171 and 173.

The insulation support layer 180 exhibits electrically insulating properties and covers the side surfaces of the first and second bulk electrodes 171 and 173 to effectively insulate the first and second bulk electrodes 171 and 173 from each other. At the same time, the insulation support layer 180 may also serve to support the first bulk electrode 171 and the second bulk electrode 173.

In a structure in which the upper surfaces of the first and second bulk electrodes 171 and 173 are partially covered by the upper insulation support layer 183, areas of exposed regions 171a and 173a of the upper surfaces of the first and second electrode 171 and 173 may be smaller than the horizontal cross-sectional areas of the first and second bulk electrodes 171 and 173, respectively. Particularly, the upper insulation support layer 183 may be disposed on the upper surfaces of the first and second bulk electrodes 171 and 173 near side surfaces of the first bulk electrode 171 and the second bulk electrode 173 facing each other. Thus, a separation distance X between an exposed region 171a of the upper surface of the first bulk electrode 171 and an exposed region 171b of the upper surface of the second bulk electrode 173 is greater than the separation distance Y between the first bulk electrode 171 and the second bulk electrode 173.

Specifically, a conductive material (for example, a solder, a conductive bonding agent, or a eutectic material) may be disposed between the exposed regions 171a and 173a of the upper surfaces and a separate substrate to bond the light emitting device 100a to the separate substrate, thereby allowing the light emitting device 100a to be mounted on the separate substrate. In order to prevent short circuit between the bulk electrodes 171 and 173 due to the conductive material provided for bonding, the separation distance X between the exposed regions 171a and 173a of the upper surface is required to be a predetermined value or more. According to an exemplary embodiment, since the insulation support layer 180 may be formed to partially cover the upper surfaces of the bulk electrodes 171 and 173, the separation distance X between the exposed region 171a of the upper surface of the first bulk electrode 171 and the exposed region 171b of the upper surface of the second bulk electrode 173 may become greater than the separation distance Y between the first bulk electrode 171 and the second bulk electrode 173. Thus, the separation distance X may become a predetermined value or more to prevent a short circuit between the first and second bulk electrodes 171 and 173, and the separation distance Y between the first and second bulk electrodes 171 and 173 may become a predetermined value or less to prevent a short circuit between the first and second bulk electrodes 171 and 173. With this structure, the light emitting device 100a may have improved heat dissipation efficiency while effectively minimizing or preventing a short circuit during a process of mounting the light emitting device 100a.

The separation distance X between the exposed region 171a of the upper surface of the first bulk electrode 171 and the exposed region 171b of the upper surface of the second bulk electrode 173 may be about 250 μm or more when the light emitting device 100a is mounted on a separate substrate by soldering, and may be about 80 μm or more when the light emitting device 100a is mounted on a separate substrate by eutectic bonding. However, it should be understood that the present disclosure is not limited thereto.

In addition, there is no limitation as to the configuration of the upper insulation support layer 183 on other regions except that the upper insulation support layer 183 is disposed on the upper surfaces of the first and second bulk electrodes near the side surfaces of the first bulk electrode 171 and the second bulk electrode 173 facing each other such that the separation distance X between the exposed region 171a of the upper surface of the first bulk electrode 171 and the exposed region 171b of the upper surface of the second bulk electrode 173 becomes a predetermined value or more. For example, as shown in FIG. 1 and FIG. 2, a portion of the insulation support layer 180 disposed between the first and second bulk electrodes 171 and 173 may have a T-shaped cross-section, and a portion of the insulation support layer 180 covering outer peripheral side surfaces of the first and second bulk electrodes 171 and 173 may have an L-shaped cross-section.

The insulation support layer 180 may be formed of a different material than the bulk electrodes 171 and 173. Particularly, the insulation support layer 180 may include an insulating polymer and/or an insulating ceramic material, and the bulk electrodes 171 and 173 may include a metallic material. Accordingly, delamination or cracking may occur at interfaces between the insulation support layer 180 and the bulk electrodes 171 and 173, and failure caused by stress and strain due to bonding of different materials may also occur thereon. When the insulation support layer 180 and/or the bulk electrodes 171 and 173 are damaged, the light emitting structure 120 may be contaminated, and the light emitting structure 120 may suffer from cracking, thereby deteriorating reliability of the light emitting device 100a. According to exemplary embodiments, the insulation support layer 180 is formed to cover the side surfaces of the first and second bulk electrodes 171 and 173, and portions of the upper surfaces of the first and second bulk electrodes 171 and 173, thereby improving mechanical stability between the insulation support layer 180 and the bulk electrodes 171 and 173. As a result, the light emitting device 100a may have improved reliability.

As the mechanical stability of the light emitting device 100a is improved, it is possible to prevent damage to the light emitting structure 120 during a process of separating the growth substrate (not shown) from the light emitting structure 120.

Furthermore, the lower insulation support layer 181 and the upper insulation support layer 183 may be formed of the same material or different materials.

When the lower insulation support layer 181 and the upper insulation support layer 183 are formed of the same material, the insulation support layer 180 may include a material such as an epoxy molding compound (EMC) or a Si resin. The insulation support layer 180 may include light reflective and light scattering particles such as $TiO_2$ particles.

When the lower insulation support layer 181 and the upper insulation support layer 183 are formed of different materials, the upper insulation support layer 183 may be formed of a material having lower brittleness and/or lower moisture absorptivity than the lower insulation support layer 181. For example, the lower insulation support layer 181 may include a material such as an epoxy molding compound (EMC) or a Si resin, and the upper insulation support layer 183 may include a material such as a photoresist (PR) and/or a photo-solder resist (PSR).

As the upper insulation support layer 183 may be formed of a material exhibiting relatively low brittleness, the upper insulation support layer 183 may be less likely to suffer from breakage or cracking than the lower insulation support layer 181, thereby preventing infiltration of external contaminants through the interfaces between the lower insulation support layer 181 and the bulk electrodes 171 and 173. As the upper insulation support layer 183 may be formed of a material exhibiting relatively low moisture absorptivity, it may be possible to prevent infiltration of external contaminants through the interfaces between the lower insulation support layer 181 and the bulk electrodes 171 and 173. For example, when the lower insulation support layer 181 is formed of a material such as EMC, which exhibits high moisture absorptivity, the light emitting device 100*a* may be more effectively protected from moisture by the upper insulation support layer 183 formed of a material such as PSR. Particularly, the structure wherein the upper insulation support layer 183 is formed to cover the interfaces between the lower insulation support layer 181 and the bulk electrodes 171 and 173 may function to protect the light emitting device 100*a*.

The exposed region 171*a* of the upper surface of the first bulk electrode 171 may have a smaller area than a contact region between the first bulk electrode 171 and the first contact electrode 130, and the exposed region 173*a* of the upper surface of the second bulk electrode 173 may have a larger area than a contact region between the second bulk electrode 173 and the second contact electrode 140. In this structure, the first bulk electrode 171 may have a larger horizontal cross-sectional area than the second bulk electrode 173.

That is, with a structure in which the horizontal cross-sectional area of the first bulk electrode 171 is larger than that of the second bulk electrode 173, the light emitting device 100*a* may achieve an improvement in heat dissipation efficiency. At the same time, a ratio of the area of the exposed region 171*a* of the upper surface of the first bulk electrode 171 to the area of the exposed region 173*a* of the upper surface of the second bulk electrode 173 is set to be lower than a ratio of the horizontal cross-sectional area of the first bulk electrode 171 to the horizontal cross-sectional area of the second bulk electrode 173 such that the exposed regions 171*a* and 173*a* of the upper surfaces exposed to the mounting plane for the light emitting device 100*a* may have substantially similar areas. With this structure, the light emitting device 100*a* may achieve a further improvement in heat dissipation efficiency without changing the process of mounting the light emitting device 100*a* on the separate substrate.

In an exemplary embodiment, the insulation support layer 180 may cover the side surface of the light emitting structure 120, thereby causing a change of an emission angle of light emitted from the light emitting structure 120. In the structure wherein the insulation support layer 180 further covers at least a portion of the side surface of the light emitting structure 120, some of light emitted through the side surface of the light emitting structure 120 may be reflected towards a lower surface of the light emitting structure 120. In this way, the light emission angle of the light emitting device 100*a* may be adjusted by adjusting a region to be formed with the insulation support layer 180.

The light emitting device 100*a* may further include a wavelength conversion portion (not shown), through which light emitted from the light emitting structure 120 is subjected to wavelength conversion, so that the light emitting device 100*a* may emit various colors. For example, with a structure wherein the wavelength conversion portion includes phosphors emitting red and green light and the light emitting structure 120 emits blue light, the light emitting device 100*a* may emit white light. Accordingly, it may be possible to provide a wafer level white light emitting device having a small size and high output.

The wavelength conversion portion may be formed on the lower surface of the light emitting structure 120, and may also be formed to cover the side surface of the light emitting structure 120, without being limited thereto.

Figure 3:
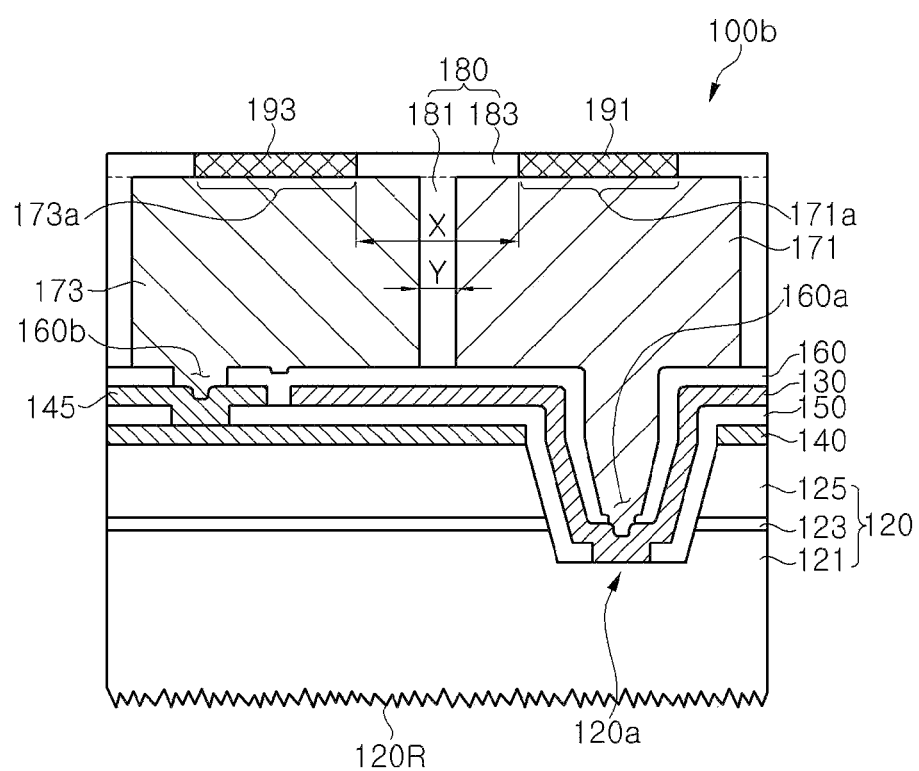
FIG. 3 is a cross-sectional view of a light emitting device according to another exemplary embodiment.

FIG. 3 is a cross-sectional view of a light emitting device according to another exemplary embodiment.

A light emitting device 100*b* according to the exemplary embodiment shown in FIG. 3 is generally similar to the light emitting device 100*a* shown in FIG. 1 and FIG. 2 and further includes a first electrode pad 191 and a second electrode pad 193. Hereinafter, different features of the light emitting device 100*b* according to this exemplary embodiment will be mainly described, and detailed descriptions of the same components will be omitted.

Referring to FIG. 3, the light emitting device 100*b* may include a light emitting structure 120, a first contact electrode 130, a second contact electrode 140, insulation layers 150 and 160, first and second bulk electrodes 171 and 173, an insulation support layer 180, a first electrode pad 191, and a second electrode pad 193. The light emitting device 100*b* may further include a growth substrate (not shown), a wavelength conversion portion (not shown), and a connection electrode 145.

The first electrode pad 191 and the second electrode pad 193 may be disposed on the first bulk electrode 171 and the second bulk electrode 173, respectively, and may at least partially fill the third opening 180*a* and the fourth opening 180*b* of the insulation support layer 180, respectively. With this structure, the first electrode pad 191 and the second electrode pad 193 may cover the exposed region 171*a* of the upper surface of the first bulk electrode 171 and the exposed region 173*a* of the upper surface of the second bulk electrode 173, respectively. Accordingly, a separation distance X between the first and second electrode pads 191 and 193 may correspond to the separation distance Y between the exposed region 171*a* of the upper surface of the first bulk electrode 171 and the exposed region 171*b* of the upper surface of the second bulk electrode 173.

As shown in the drawings, upper surfaces of the first electrode pad 191 and the second electrode pad 193 may be flush with an upper surface of the insulation support layer 180. With this structure, the light emitting device 100b may have a substantially flat upper surface.

The first and second electrode pads 191 and 193 may be formed to fill the openings of the insulation support layer 180 by plating and the like. Then, the first and second electrode pads 191 and 193 and the insulation support layer 180 may be partially removed by physical and/or chemical methods such as lapping or chemical mechanical polishing (CMP), so that the upper surfaces of the first electrode pad 191 and the second electrode pad 193 may become generally flush with the upper surface of the insulation support layer 180.

The first electrode pad 191 and the second electrode pad 193 may include a conductive material, particularly, a metallic material such as Ni, Pt, Pd, Rh, W, Ti, Al, Au, Sn, Cu, Ag, Bi, In, Zn, Sb, Mg, Pb, and the like. The first and second electrode pads 191 and 193 may be formed of substantially the same material as the bulk electrodes 171 and 173, or may be formed of a different material than the bulk electrodes 171 and 173. The first and second electrode pads 191 and 193 may be formed by deposition or a plating process such as electroless plating.

In the structure wherein the light emitting device 100b further includes the first and second electrode pads 191 and 193, the upper surface of the light emitting device 100b (which may be a surface of the light emitting device 100b mounted on a separate substrate) may become generally flat. With this structure, the light emitting device 100b may be more easily mounted on the separate substrate.

In fabricating the light emitting device 100b, when there is a step on a surface opposite the surface on which the growth substrate (not shown) is disposed, the light emitting structure 120 may be highly likely to suffer from cracking or damage in the process of separating the growth substrate from the light emitting structure 120. According to this exemplary embodiment, the surface opposite the surface on which the growth substrate (not shown) is disposed may become generally flat by the first and second electrode pads 191 and 193, thereby minimizing or preventing damage to the light emitting structure 120 during the process of separating the growth substrate. Accordingly, the light emitting device 100b may provide high yield and high reliability.

Figure 4A:
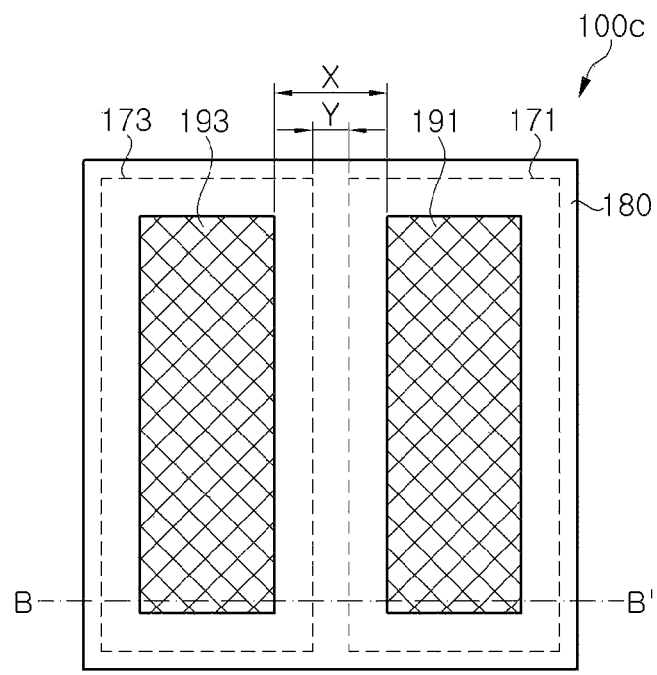
FIGS. 4a and 4b are plan views of a light emitting device according to a further exemplary embodiment.
Figure 4B:
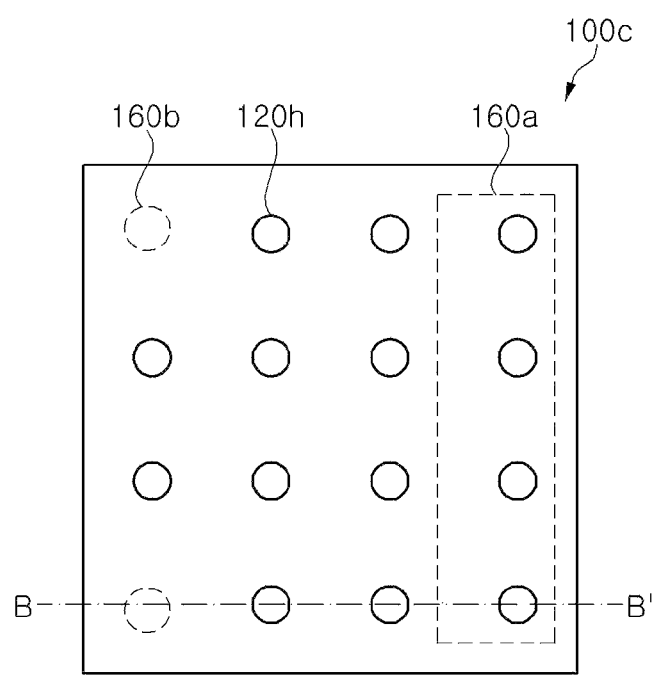
Figure 5:
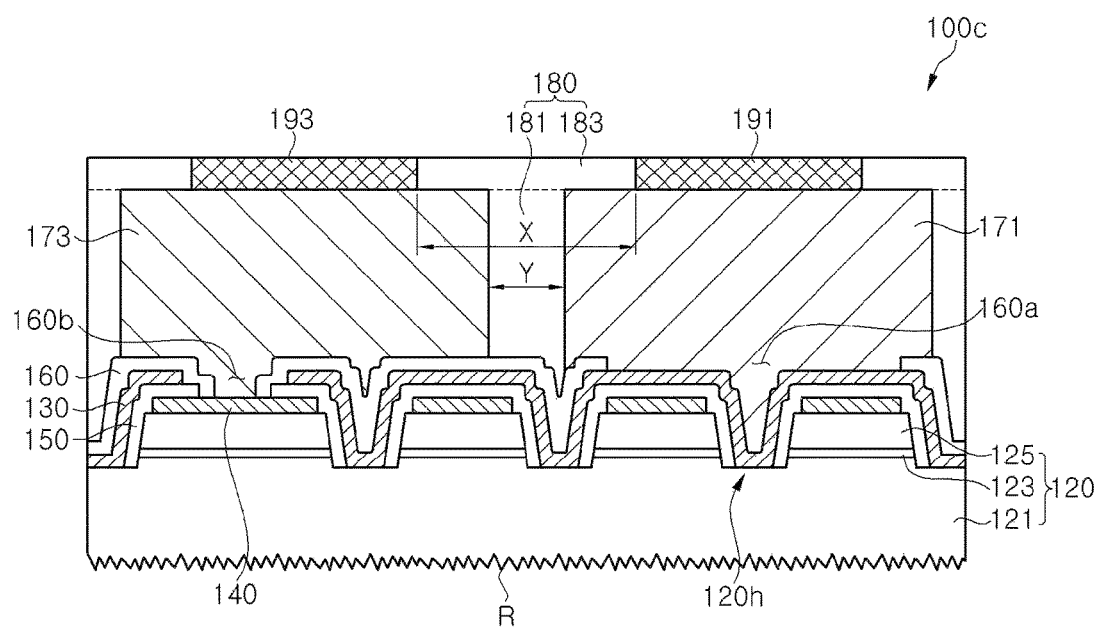
FIG. 5 is a cross-sectional view of the light emitting device taken along line B-B' of FIGS. 4a and 4b.

FIG. 4a and FIG. 4b are plan views of a light emitting device according to a further exemplary embodiment, and FIG. 5 is a cross-sectional view of the light emitting device taken along line B-B' of FIGS. 4a and 4b.

A light emitting device 100c according to this exemplary embodiment includes a different light emitting structure 120 than the light emitting device 100a shown in FIG. 1 and FIG. 2. As a result, structural relationships between other components of the light emitting device according to this exemplary embodiment may be different from those of the light emitting device according to other exemplary embodiments, and the following description will be mainly given to such different features. Detailed descriptions of the same components will be omitted.

FIG. 4a is a plan view of the light emitting device according to this exemplary embodiment, FIG. 4b is a plan view illustrating locations of holes 120h, a first opening 160a and second openings 160b of the light emitting device, and FIG. 5 is a cross-sectional view taken along line B-B' of FIGS. 4a and 4b.

Referring to FIGS. 4a, 4b, and 5, the light emitting device 100c includes a light emitting structure 120, a first contact electrode 130, a second contact electrode 140, insulation layers 150, 160, first and second bulk electrodes 171 and 173, and an insulation support layer 180. The light emitting device 100c may further include a growth substrate (not shown), a wavelength conversion portion (not shown), a first electrode pad 191, and a second electrode pad 193.

The light emitting structure 120 may include a partially exposed region of the first conductive type semiconductor layer 121 formed by partially removing the second conductive type semiconductor layer 125 and the active layer 123. As shown in the drawings, the light emitting structure 120 may include a plurality of holes 120h formed through the second conductive type semiconductor layer 125 and the active layer 123 to expose the first conductive type semiconductor layer 121 therethrough. The holes 120h may be generally arranged in a regular pattern throughout the light emitting structure 120. However, it should be understood that the present disclosure is not limited thereto, and the arrangement and the number of holes 120h may be changed in various ways.

The structure exposing the first conductive type semiconductor layer 121 is not limited to the holes 120h. For example, the exposed region of the first conductive type semiconductor layer 121 may be in the form of lines or a combination of lines and holes.

The second contact electrode 140 may be disposed on the second conductive type semiconductor layer 125 to form an ohmic contact therewith. The second contact electrode 140 may be disposed to cover an upper surface of the second conductive type semiconductor layer 125, or may be formed to cover entirety substantial portion of the upper surface of the second conductive type semiconductor layer 125. The second contact electrode 140 may be formed as a monolithic layer over the entirety of the light emitting structure 120. In this structure, the second contact electrode 140 may include opening regions corresponding to locations of the plurality of holes 120h. With this structure, the light emitting device allows a uniform supply of electric current to the entire region of the light emitting structure 120, thereby improving current spreading efficiency.

However, it should be understood that the present disclosure is not limited thereto. Alternatively, the second contact electrode 140 may be composed of a plurality of unit contact electrodes.

The first insulation layer 150 may partially cover an upper surface of the light emitting structure 120 and the second contact electrode 140. The first insulation layer 150 may cover side surfaces of the plurality of holes 120h and may include an opening exposing portions of the first conductive type semiconductor layer 121 disposed on lower surfaces of the holes 120h. The opening may be disposed corresponding to the locations of the plurality of holes 120h. The first insulation layer 150 may include an opening exposing a portion of the second contact electrode 140. The first insulation layer 150 may cover a side surface of at least a portion of the light emitting structure 120.

The first contact electrode 130 may partially cover the light emitting structure 120 and may form an ohmic contact with the first conductive type semiconductor layer 121 through the holes 120a and the opening of the first insulation layer 150 disposed corresponding to the holes 120a. Although not shown in the drawings, the first contact electrode 130 may be formed to cover the side surface of the light emitting structure 120.

The second insulation layer 160 may partially cover the first contact electrode 130, and may include a first opening 160a which partially exposes the first contact electrode 130 and a second opening 160b which partially exposes the second contact electrode 140. Each of the first and second openings 160a, 160b may be formed singly or in plural. The openings 160a, 160b may be disposed near opposite sides of the light emitting device, respectively.

The first bulk electrode 171 and the second bulk electrode 173 may be disposed on the light emitting structure 120 and may be electrically connected to the first contact electrode 130 and the second contact electrode 140, respectively.

A separation distance Y between the first bulk electrode 171 and the second bulk electrode 173 may be a predetermined value or less, for example, about 250 µm or less, or about 80 µm or less. The first bulk electrode 171 and the second bulk electrode 173 may have different volumes and the horizontal cross-sectional area of the first bulk electrode 171 may be larger than that of the second bulk electrode 173.

The insulation support layer 180 may be disposed on the light emitting structure 120 and covers side surfaces of the first and second bulk electrodes 171 and 173 and portions of upper surfaces thereof. The insulation support layer 180 may include a third opening 180a and a fourth opening 180b that partially expose the upper surfaces of the first bulk electrode 171 and the second bulk electrode 173, respectively. The insulation support layer 180 may include a lower insulation support layer 181 and an upper insulation support layer 183, in which the lower insulation support layer 181 may surround the side surfaces of the first and second bulk electrodes 171 and 173 and the upper insulation support layer 183 may partially cover the upper surfaces of the first and second bulk electrodes 171 and 173. The upper insulation support layer 183 may cover interfaces between the lower insulation support layer 181 and the first and second bulk electrodes 171 and 173.

In a structure in which the upper surfaces of the first and second bulk electrodes 171 and 173 are partially covered by the upper insulation support layer 183, the areas of the exposed regions 171a and 173a of the upper surfaces of the first and second electrode 171 and 173 may be smaller than the horizontal cross-sectional areas of the first and second bulk electrodes 171 and 173, respectively. Particularly, the upper insulation support layer 183 may be disposed on the upper surfaces of the first and second bulk electrodes 171 and 173 near the side surfaces of the first bulk electrode 171 and the second bulk electrode 173 which are facing each other. Thus, the separation distance X between the exposed region 171a of the upper surface of the first bulk electrode 171 and the exposed region 171b of the upper surface of the second bulk electrode 173 may be greater than the separation distance Y between the first bulk electrode 171 and the second bulk electrode 173.

The separation distance X between the exposed region 171a of the upper surface of the first bulk electrode 171 and the exposed region 171b of the upper surface of the second bulk electrode 173 may be about 250 µm or more when the light emitting device 100c is mounted on a separate substrate by soldering, and may be about 80 µm or more when the light emitting device 100c is mounted on a separate substrate by eutectic bonding. However, it should be understood that the present disclosure is not limited thereto.

The lower insulation support layer 181 and the upper insulation support layer 183 may be formed of the same material or different materials.

Particularly, when the lower insulation support layer 181 and the upper insulation support layer 183 are formed of different materials, the upper insulation support layer 183 may be formed of a material having lower brittleness and lower moisture absorptivity than the lower insulation support layer 181. The lower insulation support layer 181 may include a material such as an epoxy molding compound (EMC) or a Si resin, and the upper insulation support layer 183 may include a material such as a photoresist (PR) or a photo-solder resist (PSR).

The exposed region 171a of the upper surface of the first bulk electrode 171 may have a smaller area than a contact region between the first bulk electrode 171 and the first contact electrode 130, and the exposed region 173a of the upper surface of the second bulk electrode 173 may have a larger area than a contact region between the second bulk electrode 173 and the second contact electrode 140. In this structure, the first bulk electrode 171 may have a larger horizontal cross-sectional area than the second bulk electrode 173.

The first electrode pad 191 and the second electrode pad 193 may be disposed on the first bulk electrode 171 and the second bulk electrode 173, respectively, and may at least partially fill the third opening 180a and the fourth opening 180b of the insulation support layer 180, respectively. With this structure, the first electrode pad 191 and the second electrode pad 193 may cover the exposed region 171a of the upper surface of the first bulk electrode 171 and the exposed region 173a of the upper surface of the second bulk electrode 173, respectively. Accordingly, the separation distance X between the first and second electrode pads 191 and 193 may correspond to the separation distance Y between the exposed region 171a of the upper surface of the first bulk electrode 171 and the exposed region 171b of the upper surface of the second bulk electrode 173. As shown in the drawings, upper surfaces of the first electrode pad 191 and the second electrode pad 193 may be flush with an upper surface of the insulation support layer 180. With this structure, the light emitting device 100c may have a substantially flat upper surface.

Figure 6A:
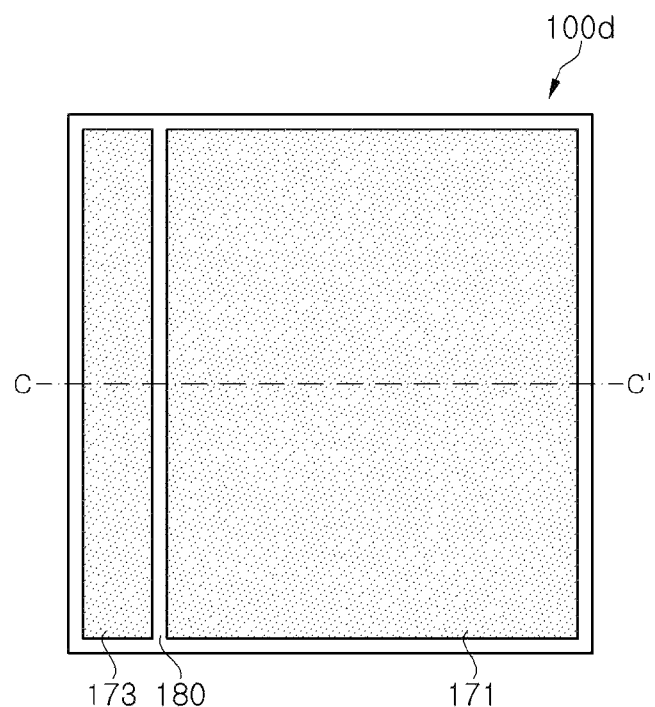
FIGS. 6a, 6b, and 7 are plan views and a cross-sectional view, respectively, of a light emitting device according to yet another exemplary embodiment.
Figure 6B:
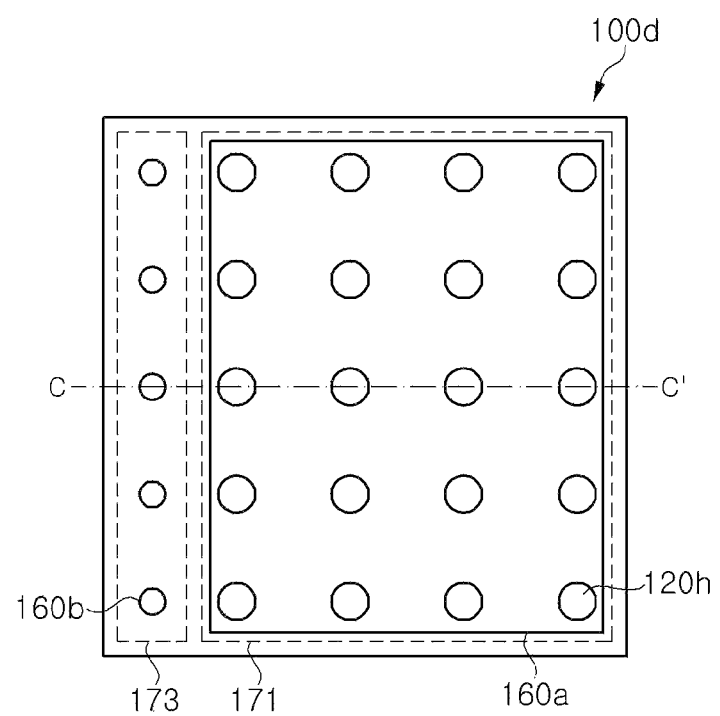
Figure 7:
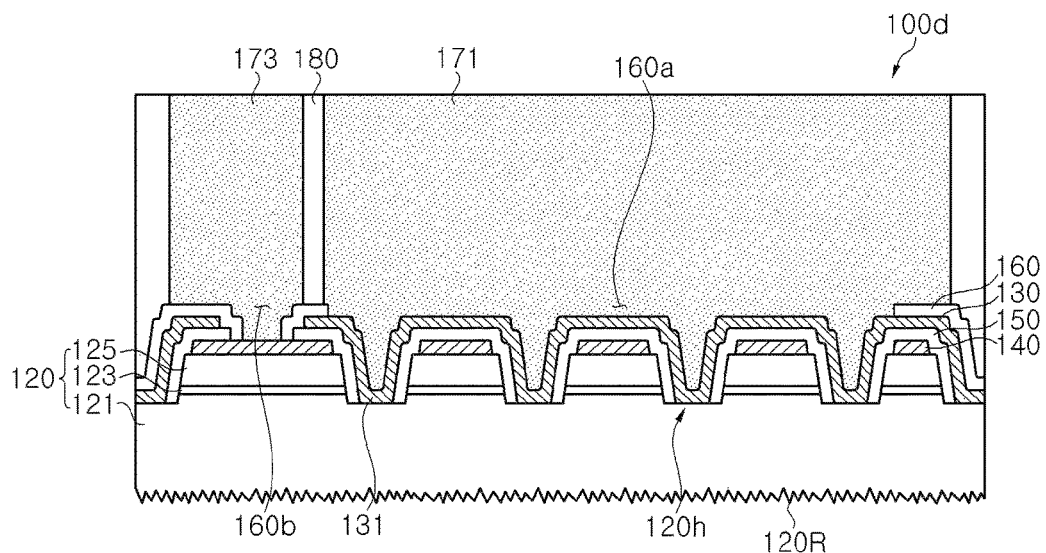

FIGS. 6a, 6b, and 7 are plan views and a cross-sectional view, respectively, of a light emitting device according to yet another exemplary embodiment.

FIG. 6a is a plan view of a light emitting device 100d, FIG. 6b is a plan view illustrating locations of holes 120h, a third opening 160a and fourth openings 160b of the light emitting device, and FIG. 7 is a cross-sectional view taken along line C-C' of FIG. 6a and FIG. 6b.

Referring to FIGS. 6a, 6b, and 7, the light emitting device 100d includes light emitting structure 120 including a first conductive type semiconductor layer 121, an active layer 123 and a second conductive type semiconductor layer 125, a first contact electrode 130, a second contact electrode 140, first and second insulation layers 150, 160, a first bulk electrode 171, a second bulk electrode 173, and an insulation support layer 180. The light emitting device 100d may further include first and second electrode pads (not shown), a growth substrate (not shown), and a wavelength conversion portion (not shown).

The light emitting structure 120 may include a first conductive type semiconductor layer 121, an active layer 123 disposed on the first conductive type semiconductor layer 121, and a second conductive type semiconductor layer 125 disposed on the active layer 123.

The light emitting structure 120 may include a partially exposed region of the first conductive type semiconductor layer 121 formed by partially removing the second conductive type semiconductor layer 125 and the active layer 123. For example, as shown in the drawings, the light emitting structure 120 may include at least one hole 120a formed through the second conductive type semiconductor layer 125 and the active layer 123 to expose the first conductive type semiconductor layer 121 therethrough.

The light emitting structure 120 may include a plurality of holes 120h, which may be generally arranged in a regular pattern. For example, as shown in FIG. 6a and FIG. 6b, the holes 120h may be arranged at constant intervals in a predetermined pattern. With a structure in which the holes 120h are arranged in a regular pattern throughout the light emitting structure, the light emitting device 100d may allow uniform current spreading in the horizontal direction upon operation thereof. However, it should be understood that the present disclosure is not limited thereto, and the arrangement and the number of holes 120h may be changed in various ways.

The structure exposing the first conductive type semiconductor layer 121 is not limited to the holes 120h. The exposed region of the first conductive type semiconductor layer 121 may be realized in the form of lines and a combination of lines and holes. When the exposed region of the first conductive type semiconductor layer 121 is in the form of plural lines, the light emitting structure 120 may be formed along the lines and may include at least one mesa including the active layer 123 and the second conductive type semiconductor layer 125. Thus, although the following description of this exemplary embodiment will be given with reference to the light emitting structure 120 including the plurality of holes 120h, it should be understood that the present disclosure is not limited thereto.

The light emitting structure 120 may further include a roughness 120R formed on a lower surface thereof. The roughness 120R may be formed by at least one of dry etching, wet etching and electrochemical etching. The roughness 120R may be formed by PEC etching or by wet etching in an etching solution containing KOH and NaOH.

The light emitting structure 120 may further include a growth substrate (not shown) disposed under the first conductive type semiconductor layer 121. As the growth substrate, any substrate may be used so long as the substrate allows growth of the light emitting structure 120 thereon. The growth substrate may be a sapphire substrate, a silicon carbide substrate, a silicon substrate, a gallium nitride substrate, or an aluminum nitride substrate. Such a growth substrate may be removed from the light emitting structure 120 by a typical method known in the art after fabrication of the light emitting device.

The second contact electrode 140 may be disposed on the second conductive type semiconductor layer 125. The second contact electrode 140 may cover at least a portion of an upper surface of the second conductive type semiconductor layer 125 and may form an ohmic contact with the second conductive type semiconductor layer 125. The second contact electrode 140 may be disposed to cover the overall upper surface of the second conductive type semiconductor layer 125. That is, the second contact electrode 140 may be formed as a monolithic layer in a region covering the upper surface of the second conductive type semiconductor layer 125 excluding a region in which the holes 120a of the light emitting structure 120 are formed. With this structure, the light emitting device may allow a uniform supply of electric current to the entire region of the light emitting structure 120, thereby improving current spreading efficiency.

However, it should be understood that the present disclosure is not limited thereto. Alternatively, the second contact electrode 140 may be composed of a plurality of unit reflective electrode layers separated from each other on the upper surface of the second conductive type semiconductor layer 125 instead of being composed of the monolithic layer.

In this exemplary embodiment, the unit reflective electrode layers may be electrically connected to each other via connecting portions.

The second contact electrode 140 may include a material capable of forming an ohmic contact with the second conductive type semiconductor layer 125 such as a metallic material or a conductive oxide.

When the second contact electrode 140 includes the metallic material, the second contact electrode 140 may include a reflective layer and a cover layer covering the reflective layer. As described above, the second contact electrode 140 may reflect light while forming an ohmic contact with the second conductive type semiconductor layer 125. The reflective layer may include a metal having high reflectivity and capable of forming ohmic contact with the second conductive type semiconductor layer 125. The reflective layer may include at least one of Ni, Pt, Pd, Rh, W, Ti, Al, Mg, Ag and Au. In addition, the reflective layer may be composed of a single layer or multiple layers.

The cover layer may prevent interdiffusion between the reflective layer and other materials and may prevent external materials from diffusing into and damaging the reflective layer. Accordingly, the cover layer may be formed to cover a lower surface and a side surface of the reflective layer. The cover layer may be electrically connected together with the reflective layer to the second conductive type semiconductor layer 125 to act as an electrode together with the reflective layer. The cover layer may include, for example, Au, Ni, Ti, or Cr, and may be composed of a single layer or multiple layers.

When the second contact electrode 140 includes the conductive oxide, the conductive oxide may include ITO, ZnO, AZO, IZO, GZO, and the like. When the second contact electrode 140 includes the conductive oxide, the second contact electrode 140 may cover a larger area of the upper surface of the second conductive type semiconductor layer 125 than when the second contact electrode 140 includes a metal.

The first and second insulation layers 150 and 160 may partially cover the first and second contact electrodes 130 and 140. Next, the first insulation layer 150 will be described first and the second insulation layer 160 will be described thereafter.

The first insulation layer 150 may partially cover an upper surface of the light emitting structure 120 and the second contact electrode 140. In addition, the first insulation layer 150 may cover side surfaces of the plurality of holes 120h while partially exposing the regions of the first conductive type semiconductor layer 121 exposed through the holes 120a. Furthermore, the first insulation layer 150 may further cover at least a portion of the side surface of the light emitting structure 120.

The first insulation layer 150 may include first openings disposed corresponding to the plurality of holes 120h and second openings exposing a portion of the second contact electrode 140. The first conductive type semiconductor layer 121 may be partially exposed through the first opening and the holes 120h, and the second contact electrode 140 may be partially exposed through the second openings.

In this exemplary embodiment, the first openings and the second openings may be arranged in a certain pattern. For example, as shown in FIGS. 6a and 6b, the second openings may be disposed near one side of the light emitting device 100d, and the first openings may be regularly disposed in a region in which the second openings are not disposed.

The first insulation layer 150 may include an insulating material such as $SiO_2$, $SiN_x$, $MgF_2$, and the like. Furthermore, the first insulation layer 150 may include multiple layers and may include a distributed Bragg reflector wherein materials having different indexes of refraction are alternately stacked one above another. Particularly, when the second contact electrode 140 includes the conductive oxide, the first insulation layer 150 includes the distributed Bragg reflector, thereby improving luminous efficacy of the light emitting device 100d.

The first contact electrode 130 may partially cover the light emitting structure 120 and may form an ohmic contact with the first conductive type semiconductor layer 121 through the plurality of holes 120h and the first openings. With this structure, the first contact electrode 130 may include an ohmic contact region 131 at which the first contact electrode 130 directly contacts the first conductive type semiconductor layer 121 to form an ohmic contact. When the light emitting structure 120h includes the plurality of holes 120h, the ohmic contact region 131 may also be realized by a plurality of ohmic contact regions corresponding to the number of holes 120h.

The first contact electrode 130 may be formed to cover the majority of the upper surface of the first insulation layer 150 excluding some region thereof. The first contact electrode 130 may also be formed to cover the side surface of the light emitting structure 120. When the first contact electrode 130 is also formed on the side surface of the light emitting structure 120, the first contact electrode 130 reflects light, which is emitted to the side surface of the light emitting structure 120 from the active layer 123, in an upward direction, thereby increasing the ratio of light emitted through an upper surface of the light emitting device 100d. On the other hand, the first contact electrode 130 may not be formed in a region corresponding to the second openings of the first insulation layer 150 and may be separated and insulated from the second contact electrode 140.

With a structure in which the first contact electrode 130 is formed to cover the overall upper surface of the light emitting structure 120 excluding some region thereof, the light emitting device may have further improved current spreading efficiency. Since a portion of the light emitting structure 120 not covered by the second contact electrode 140 may be covered by the first contact electrode 130, the light emitting device 100d may allow more effective reflection of light, thereby achieving improvement in luminous efficacy.

The first contact electrode 130 may be composed of a single layer or multiple layers, and may include a highly reflective metal layer such as an Al layer. The highly reflective metal layer may be formed on a bonding layer formed of Ti, Cr or Ni, without being limited thereto. Alternatively, the first contact electrode 130 may include at least one of Ni, Pt, Pd, Rh, W, Ti, Al, Mg, Ag and Au.

Since the first contact electrode 130 forms an ohmic contact with the first conductive type semiconductor layer 121 through the holes 120h, a region from which the active layer 123 is removed to form an electrode connected to the first conductive type semiconductor layer 121 is the same as the region corresponding to the plurality of holes 120h. With this structure, the light emitting device may minimize the ohmic contact region between the first conductive type semiconductor layer 121 and the metal layer, and may have a large area ratio of a luminous region to a horizontal area in the overall light emitting structure.

The light emitting device 100d may further include a connection electrode 145.

The connection electrode 145 may be disposed on the second contact electrode 140 and may be electrically connected to the second contact electrode 140 through an opening of the first insulation layer 150. The connection electrode 145 may electrically connect the second contact electrode 140 to the second bulk electrode 173. The connection electrode 145 may partially cover the first insulation layer 150 and be separated and insulated from the first contact electrode 130. The second insulation layer 160 may partially cover the first contact electrode 130. The second insulation layer 160 may include a third opening 160a which partially exposes the first contact electrode 130 and a fourth opening 160b which partially exposes the second contact electrode 140. The fourth opening 160b may be formed at a location corresponding to the second opening.

Each of the third and fourth openings 160a and 160b may be formed singly or in plural. As shown in FIG. 6b, the fourth openings 160b may be disposed near one side of the light emitting device 100d and the third opening 160a may be formed to expose some region in which at least some of the plurality of holes 120h is formed. Furthermore, the third opening 160a may be formed to expose all of the holes 120h. With this structure, the ohmic contact regions 131 may be exposed through the third opening 160a.

The second insulation layer 160 may include an insulating material such as $SiO_2$, $SiN_x$, $MgF_2$, and the like. Furthermore, the second insulation layer 160 may include multiple layers and may include a distributed Bragg reflector wherein materials having different indexes of refraction are alternately stacked one above another.

The first bulk electrode 171 and the second bulk electrode 173 may be disposed on the light emitting structure 120 and may be electrically connected to the first contact electrode 130 and the second contact electrode 140, respectively. Particularly, the first bulk electrode 171 and the second bulk electrode 173 may be electrically connected to the first and second contact electrodes 130, 140 through direct contact therewith, respectively.

At least some holes 120h may be disposed under the first bulk electrode 171, and alternatively, all of the holes 120h may be disposed under the first bulk electrode 171. Thus, the ohmic contact region 131 of the first contact electrode 130 may be interposed between the first bulk electrode 171 and the first conductive type semiconductor layer 121, and all of the ohmic contact regions 131 of the first contact electrode 130 may directly contact the first bulk electrode 171.

On the other hand, the holes 120h may not be disposed under the second bulk electrode 173. Specifically, an ohmic contact between the first contact electrode 130 and the first conductive type semiconductor layer 121 may not be formed under a region in which the second bulk electrode 173 is formed. Accordingly, as shown in FIGS. 6a and 6b, the holes 120h of the light emitting structure 120 may be formed on regions other than a region near one side of the light emitting device 100d.

The first bulk electrode 171 and the second bulk electrode 173 may have different volumes and the first bulk electrode 171 may have a larger volume than the second bulk electrode 173. The first bulk electrode 171 and the second bulk electrode 173 may have a thickness of about 70 μm to 80 μm or more, and may have substantially the same thickness as each other. Accordingly, the first bulk electrode 171 may have a larger horizontal cross-sectional area than the second bulk electrode 173. For example, the horizontal cross-sectional area of the first bulk electrode 171 may be 0.8 times to less than 1 times the sum of the horizontal cross-sectional areas of the first and second bulk electrodes 171 and 173.

That is, the light emitting device 100d may include the first bulk electrode 171, the horizontal cross-sectional area of which is much larger than the horizontal cross-sectional area of the second bulk electrode 173. When the first conductive type semiconductor layer 121 is an n-type semiconductor layer, the first bulk electrode 171 may also act as an N-electrode, and as described above, upon operation of the light emitting device 100d, light emission and heat generation mainly occur from the region in which the first bulk electrode 171 is disposed. Accordingly, as in this exemplary embodiment, with a structure in which the horizontal cross-sectional area of the first bulk electrode 171 may be much larger than the horizontal cross-sectional area of the second bulk electrode 173, the light emitting device 100d may uniformly emit light throughout the overall luminous region to achieve improvement in luminous characteristics, and may allow efficient heat dissipation through the first bulk electrode 171 to achieve improvement in heat dissipation efficiency.

The first bulk electrode 171 may directly contact the first contact electrode 130 and also directly contact all of the ohmic contact regions 131 of the first contact electrode 130. Here, the ohmic contact regions 131 correspond to the locations of the plurality of holes 120h, and the holes 120h are generally arranged in a regular pattern throughout the light emitting structure 120. With this structure, the light emitting device 100d may achieve improvement in electrical characteristics through uniform current spreading in the horizontal direction, and may efficiently dissipate heat generated from the light emitting structure 120 through the ohmic contact regions 131 and the first bulk electrode 171.

In addition, with the structure wherein the ohmic contact region between the first contact electrode 130 and the first conductive type semiconductor layer 121 is not present under the region in which the second bulk electrode 173 is formed, the light emitting device may permit heat generated from the ohmic contact region between the first conductive type semiconductor layer 121 and the first contact electrode 130 to be completely dissipated through the first bulk electrode 171. Accordingly, the light emitting device 100d may achieve an improvement in heat dissipation efficiency.

As described above, according to this exemplary embodiment, the light emitting device 100d may achieve improvement in luminous efficacy and heat dissipation efficiency, thereby improving reliability and lifespan.

Each of the first bulk electrode 171 and the second bulk electrode 173 may include metal particles and a non-metallic material interposed between the metal particles. Each of the first and second bulk electrodes 171 and 173 may include sintered metal particles including the metal particles and the non-metallic material. Within the sintered metal particles, the metal particles are sintered to have a plurality of grains and the non-metallic material is interposed in at least some region between the metal particles. Such a non-metallic material may act as a buffer capable of relieving stress exerted upon the first bulk electrode 171 and the second bulk electrode 173. With this structure, mechanical stability of the first bulk electrode 171 and the second bulk electrode 173 may be improved, thereby relieving stress applied from the electrode 160 to the light emitting structure 120.

In each of the first bulk electrode 171 and the second bulk electrode 173, the metal particles may be present in an amount of 80 wt % to 98 wt %. Within this content range of the metal particles, the first bulk electrode 171 and the second bulk electrode 173 may exhibit excellent properties in terms of thermal conductivity and electrical conductivity, and may effectively relieve stress, which may be applied to the bulk electrodes 171 and 173, thereby improving mechanical stability of the bulk electrodes 171 and 173.

The metal particles may be formed of any material so long as the material can exhibit thermal conductivity and electrical conductivity, and may include Cu, Au, Ag, Pt, and the like. The non-metallic material may be derived from a material such as a carbon-containing polymer material, which may be used as a sintering target for formation of electrodes.

Although metal particles may be included in the form of the sintered metal particles in the first and second bulk electrodes 171 and 173 in the above exemplary embodiment, it should be understood that the present disclosure is not limited thereto. The first bulk electrode 171 and the second bulk electrode 173 may be formed through deposition and/or plating of metal. The first bulk electrode 171 and the second bulk electrode 173 may be composed of multiple layers.

The first bulk electrode 171 and the second bulk electrode 173 may have side surfaces substantially perpendicular to an upper surface of the second insulation layer 160. However, it should be understood that the present disclosure is not limited thereto. In an alternative exemplary embodiment, as shown in FIG. 8, each of first and second bulk electrodes 271 and 273 includes an inclined side surface.

Figure 8:
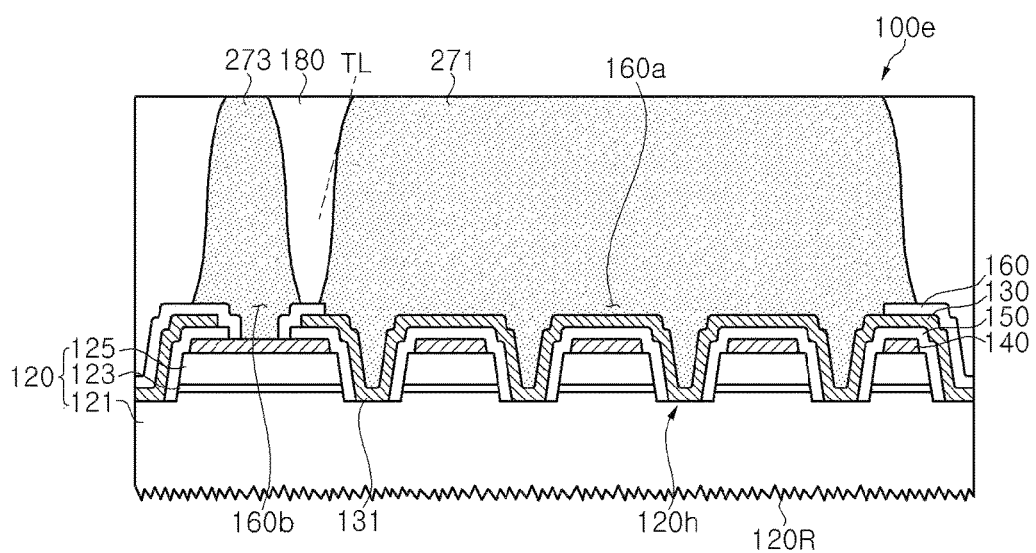
FIG. 8 is a sectional view of a light emitting device according to yet another exemplary embodiment.

FIG. 8 is a sectional view of a light emitting device 100e according to yet another exemplary embodiment, in which the bulk electrodes 271, 273 have inclined side surfaces unlike the light emitting device 100d shown in FIGS. 6a, 6b, and 7.

Referring to FIG. 8, each of the first bulk electrode 271 and the second bulk electrode 273 may include an inclined side surface. Particularly, as shown in FIG. 8, each of the first bulk electrode 271 and the second bulk electrode 273 may include an inclined side surface on which a gradient of a tangential line TL of a vertical cross-section thereof with respect to the side surface varies. Specifically, the gradient of the tangential line TL of each of the first and second bulk electrodes 271 and 273 with respect to the side surface thereof may gradually increase from a lower side thereof in an upwards direction and may gradually decrease from a predetermined point of inflection in an upwards direction. Accordingly, the inclined side surface of each of the first and second bulk electrodes 271 and 273 may include a region in which the gradient of the tangential line TL increases and a region in which the gradient of the tangential line TL decreases.

With the structure wherein each of the first and second bulk electrodes 271 and 273 has the inclined side surface on which the gradient of the tangential line TL of the vertical cross-section thereof with respect to the side surface varies, the horizontal cross-section of each of the first and second bulk electrodes 271 and 273 varies in the vertical direction. As shown in the drawings, the horizontal cross-section of each of the first and second bulk electrodes 271 and 273 may gradually decrease with increasing distance from the upper surface of the light emitting structure 120.

Each of the first and second bulk electrodes 271 and 273 may have a shape capable of providing the side surface as described above, for example, a frusto-conical shape. With a structure in which each of the first and second bulk electrodes 271 and 273 includes an inclined side surface on which the gradient of the tangential line TL of the vertical cross-section thereof varies with respect to the side surface, mechanical stability at interfaces between the first and second bulk electrodes 271 and 273 and the insulation support layer 180 may be improved.

Referring again to FIGS. 6a, 6b, and 7, the first bulk electrode 171 and the second bulk electrode 173 may directly contact the first contact electrode 130 and the second contact electrode 140, respectively. That is, the first bulk electrode 171 and the second bulk electrode 173 may be directly formed on the first and second contact electrodes, respectively, thereby allowing elimination of an additional component such as a seed layer required for plating or a wetting layer required for soldering. However, it should be understood that the present disclosure is not limited thereto.

A minimum distance between the first bulk electrode 171 and the second bulk electrode 173 may be about 10 µm to about 80 µm. With this structure, the light emitting device 100d may prevent an increase in forward voltage Vf due to an increase in distance between the electrodes, and may allow an increase in the horizontal cross-sectional areas of the bulk electrodes 171 and 173 due to the decreased distance between the electrodes, and thereby may achieve an improvement in heat dissipation efficiency.

The insulation support layer 180 may be formed on the light emitting structure 120 to at least partially cover the side surfaces of the first and second bulk electrodes 171 and 173. The first bulk electrode 171 and the second bulk electrode 173 may be exposed to an upper surface of the insulation support layer 180.

The insulation support layer 180 exhibits electrically insulating properties and covers the side surfaces of the first and second bulk electrodes 171 and 173 to effectively insulate the first and second bulk electrodes 171 and 173 from each other. The insulation support layer 180 may also serve to support the first bulk electrode 171 and the second bulk electrode 173. The upper surface of the insulation support layer 180 may be substantially flush with the upper surfaces of the first bulk electrode 171 and the second bulk electrode 173.

The insulation support layer 180 may include an insulating polymer and/or an insulating ceramic material, for example, an epoxy molding compound (EMC) or a Si resin. The insulation support layer 180 may also include light reflective and light scattering particles such as $TiO_2$ particles.

Although not shown in the drawings, the insulation support layer 180 may also cover the side surface of the light emitting structure 120, thereby causing change of an emission angle of light emitted from the light emitting structure 120. In the structure wherein the insulation support layer 180 further covers at least a portion of the side surface of the light emitting structure 120, some of light emitted through the side surface of the light emitting structure 120 may be reflected towards a lower surface of the light emitting structure 120. In this way, the light emission angle of the light emitting device 100d may be adjusted by adjusting a region in which the insulation support layer 180 will be formed.

The light emitting device 100d may further include a first electrode pad (not shown) and a second electrode pad (not shown). The first and second electrode pads may be disposed on the insulation support layer 180 and electrically connected to the first and second bulk electrodes 171 and 173, respectively.

When the light emitting device 100d is applied to a module and the like, the first and second electrode pads allow the light emitting device 100d to be more stably mounted on a separate substrate. For example, when the first and second bulk electrodes 171 and 173 include sintered Cu or Ag particles, the first and second bulk electrodes 171 and 173 exhibit poor wettability with respect to solder and the like. Accordingly, with a structure in which the first and second electrode pads are disposed on the insulation support layer 180, the light emitting device 100d may be stably mounted on the separate substrate.

The first and second electrode pads (not shown) may be formed in a shape as shown in FIG. 3. That is, the light emitting device 100d according to this exemplary embodiment may further include the first and second electrode pads, in which the insulation support layer 180 may include a lower insulation support layer covering the side surfaces of the first and second bulk electrodes 171 and 173 and an upper insulation support layer partially covering the upper surfaces of the first and second bulk electrodes 171 and 173. In this exemplary embodiment, at least portions of the side surfaces of the first and second electrode pad may be covered by the upper insulation support layer.

The first and second electrode pads may include a conductive material such as a metal such as Ni, Pt, Pd, Rh, W, Ti, Al, Ag, Sn, Cu, Ag, Bi, In, Zn, Sb, Mg, Pb, and the like. In addition, each of the first and second electrode pads may be composed of a single layer or multiple layers.

A wavelength conversion portion (not shown) may be disposed on the lower surface of the light emitting structure 120. The wavelength conversion portion converts the wavelength of light emitted from the light emitting structure 120 such that the light emitting device may emit light in a desired wavelength band. The wavelength conversion portion may include a phosphor and a support containing the phosphor. The phosphor may include various phosphors known to a person having ordinary knowledge in the art, and may include at least one type of phosphor selected from among garnet phosphors, aluminate phosphors, sulfide phosphors, oxynitride phosphors, nitride phosphors, fluoride phosphors, and silicate phosphors. The supporter may be selected from any material well known to a person having ordinary knowledge in the art, and may include, for example, a polymer resin such as an epoxy resin or acryl resin, or a silicon resin. The wavelength conversion portion may be composed of a single layer or multiple layers.

The wavelength conversion portion may cover the lower surface of the light emitting structure 120 and may further cover the side surface of the light emitting structure 120. In some exemplary embodiments, the wavelength conversion portion may further cover the side surface of the insulation support layer 180.

Although the light emitting device 100d according to this exemplary embodiment has the light emitting structure 120 including the plurality of holes 120h, it should be understood that the present disclosure is not limited thereto. The connection and positional relationship between the light emitting structure 120, the first and second contact electrodes 130 and 140, and the first and second insulation layers 150 and 160 may be modified in various ways without departing from the scope of the present disclosure.

Figure 9A:
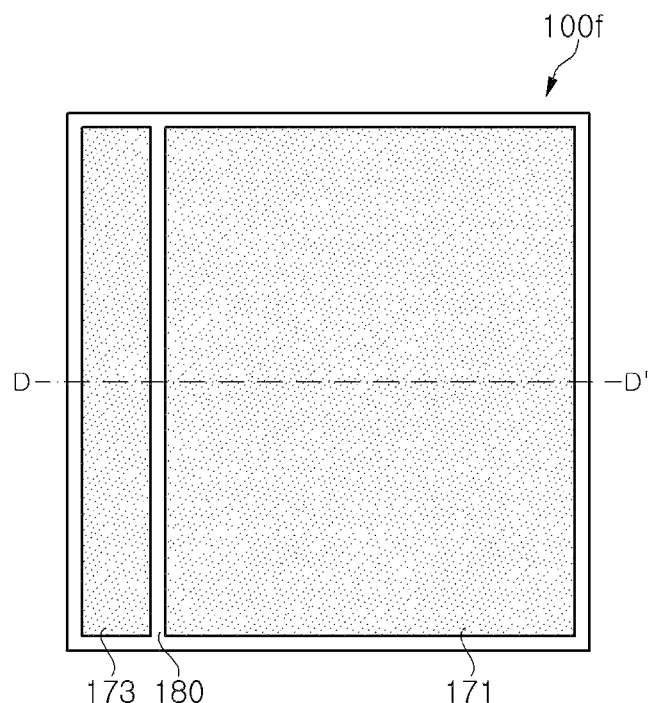
FIGS. 9a, 9b, and 10 are plan views and a cross-sectional view, respectively, of a light emitting device according to yet another exemplary embodiment.
Figure 9B:
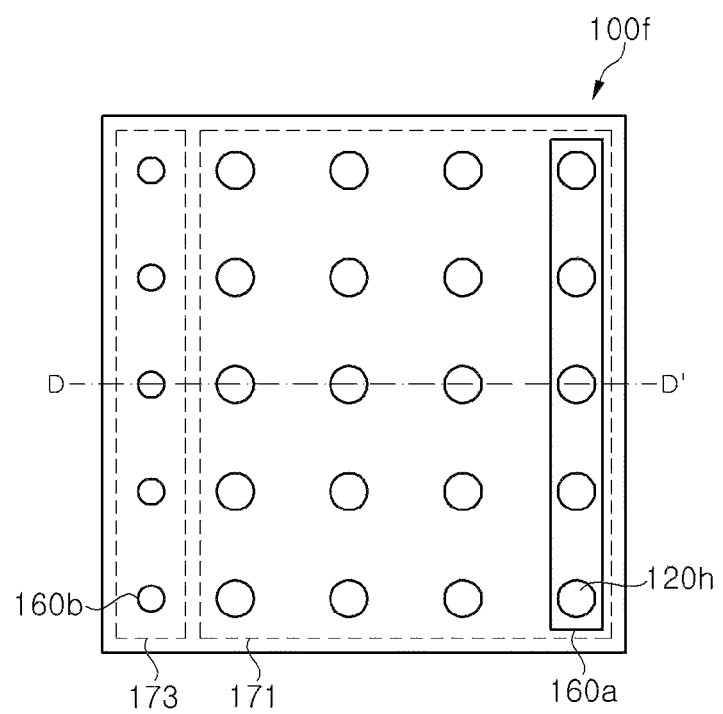
Figure 10:
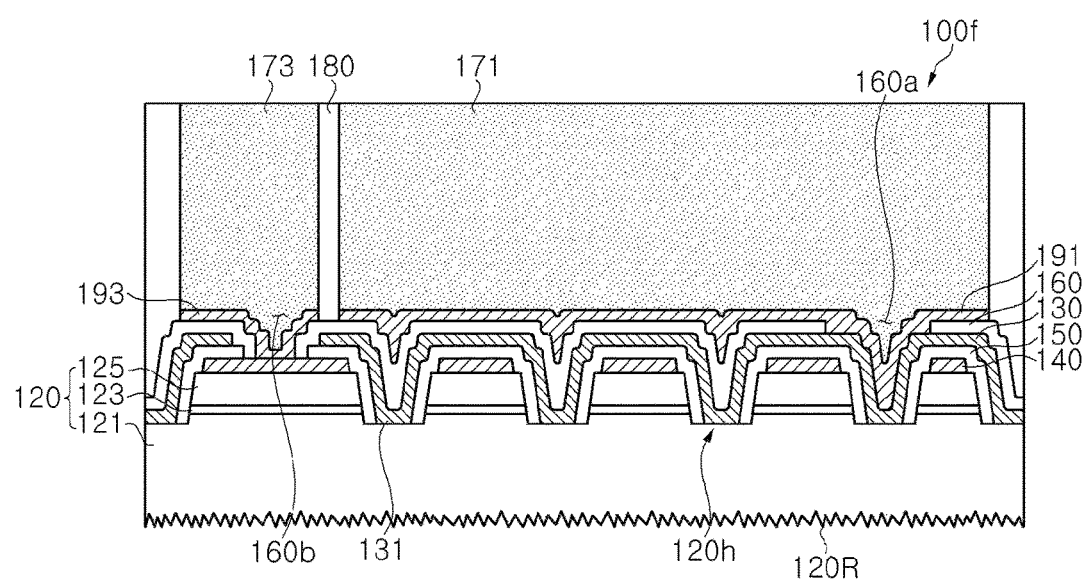

FIGS. 9a, 9b, and 10 are plan views and a cross-sectional view, respectively, of a light emitting device according to yet another exemplary embodiment.

A light emitting device 100f according to the exemplary embodiment shown in FIGS. 9a, 9b, and 10 is generally similar to the light emitting device 100d shown in FIGS. 6a, 6b, and 7, excluding some features of the third opening 160a and further includes first and second interconnection layers 191 and 193. Hereinafter, different features of the light emitting device 100f according to this exemplary embodiment will be mainly described, and detailed descriptions of the same components will be omitted.

FIG. 9a is a plan view of the light emitting device 100f, FIG. 9b is a plan view illustrating locations of holes 120h, a third opening 160a and fourth openings 160b, and FIG. 10 is a cross-sectional view taken along line D-D' of FIGS. 9a and 9b.

Referring to FIGS. 9a, 9b, and 10, the light emitting device 100f includes a light emitting structure 120 that includes a first conductive type semiconductor layer 121, an active layer 123 and a second conductive type semiconductor layer 125, a first contact electrode 130, a second contact electrode 140, first and second insulation layers 150 and 160, a first bulk electrode 171, a second bulk electrode 173, an insulation support layer 180, a first interconnection layer 191, and a second interconnection layer 193. The light emitting device 100f may further include first and second electrode pads (not shown), a growth substrate (not shown), and a wavelength conversion portion (not shown).

The third opening 160a of the second insulation layer 160 may partially expose the first contact electrode 130 while covering the first contact electrode 130. Here, the third opening 160a may be formed only in a region in which some of the holes 120h are disposed. Accordingly, only some of the ohmic contact regions 131 may be exposed through the third opening 160a and the other ohmic contact regions 131 may be covered by the second insulation layer 160.

The third opening 160a may be disposed at a location opposite the location of the fourth openings 160b. Specifically, when the fourth openings 160b are disposed near one side of the light emitting device 100f, the third opening 160a may be disposed near the other side of the light emitting device 100f opposite the one side thereof.

The light emitting device 100f according to this exemplary embodiment may further include a first interconnection layer 191 and a second interconnection layer 193 respectively disposed under the first bulk electrode 171 and the second bulk electrode 173.

The first interconnection layer 191 may electrically connect the first contact electrode 130 to the first bulk electrode 171, and the second interconnection layer 193 may electrically connect the second contact electrode 140 to the second bulk electrode 173.

When the first bulk electrode 171 and the second bulk electrode 173 are formed by deposition or plating, the first and second interconnection layers 191 and 193 may act as seed layers. When the first bulk electrode 171 and the second bulk electrode 173 are formed by sintering, the first and second interconnection layers 191 and 193 may act as wetting layers to assist in stable formation of the first bulk electrode 171 and the second bulk electrode 173. Accordingly, the first and second bulk electrodes 171 and 173 may be stably bonded to the light emitting structure 120 by the first and second interconnection layers 191 and 193.

The interconnection layers 191 and 193 may include a metallic material so as to act as the seed layers or the wetting layers. The interconnection layers 191 and 193 may include Cu, Au, Ag, Ni, Pt, and the like.

The interconnection layers 191 and 193 are not limited to this exemplary embodiment and may be applied to other exemplary embodiments.

Figure 11A:
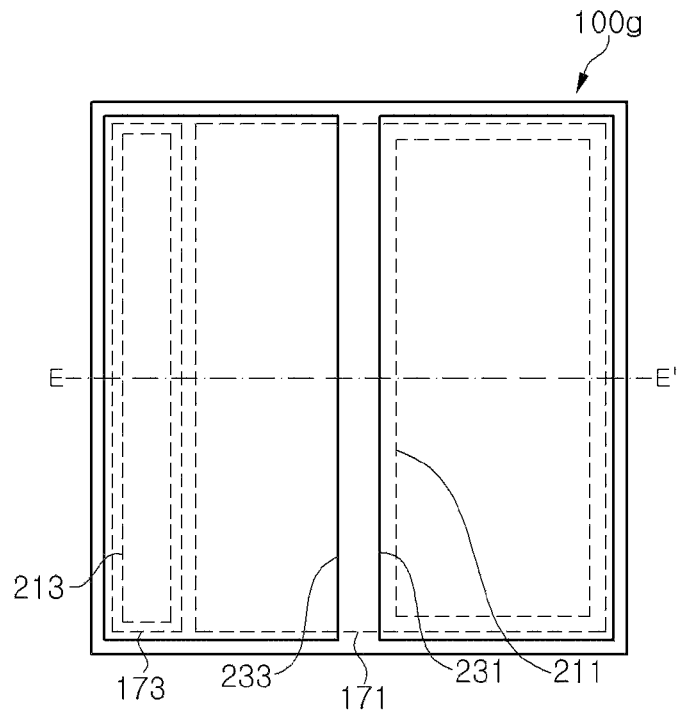
FIGS. 11a, 11b, and 12 are plan views and a cross-sectional view, respectively, of a light emitting device according to yet another exemplary embodiment.
Figure 11B:
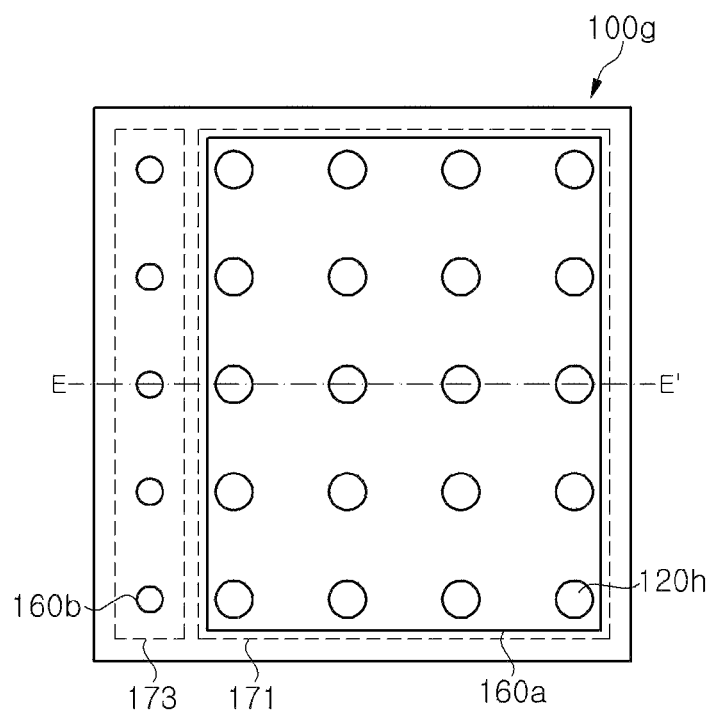
Figure 12:
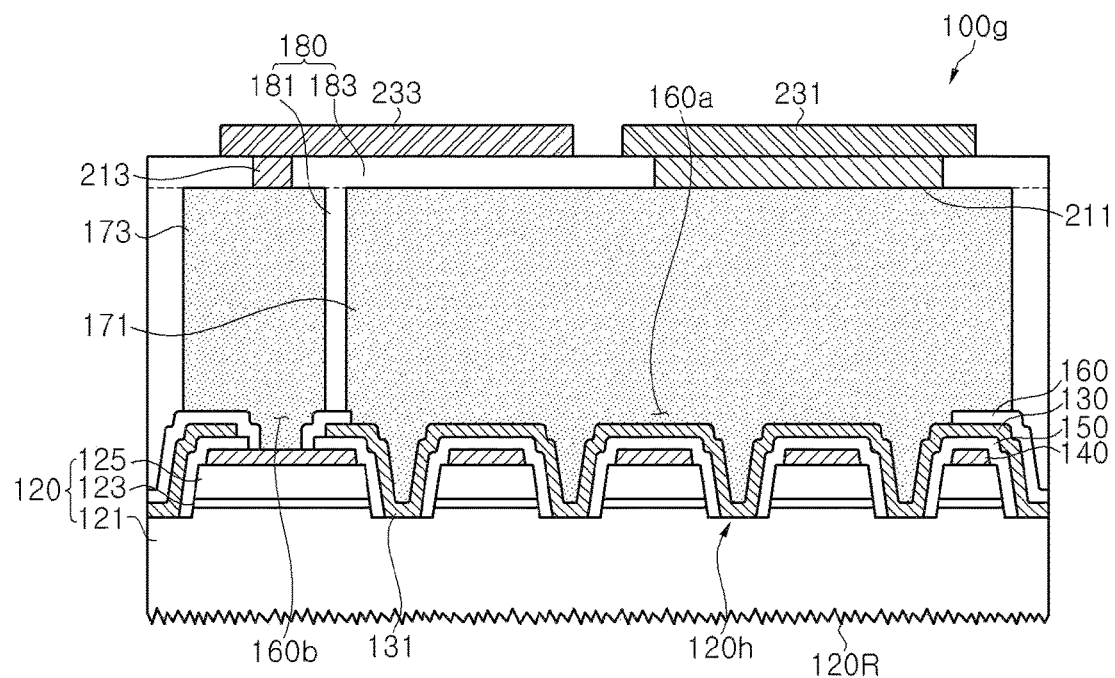

FIGS. 11a, 11b, and 12 are plan views and a cross-sectional view, respectively, of a light emitting device according to yet another exemplary embodiment.

A light emitting device 100g according to the exemplary embodiment shown in FIGS. 11a, 11b, and 12 is generally similar to the light emitting device 100d shown in FIGS. 6a, 6b, and 7, and further includes connection layers 211 and 213 and electrode pads 231 and 233. Hereinafter, different features of the light emitting device 100g according to this exemplary embodiment will be mainly described, and detailed descriptions of the same components will be omitted.

FIG. 11a is a plan view of the light emitting device 100g, FIG. 11b is a plan view illustrating locations of holes 120h, a third opening 160a and fourth openings 160b, and FIG. 12 is a cross-sectional view taken along line E-E' of FIGS. 11a and 11b.

Referring to FIGS. 11a, 11b, and 12, the light emitting device 100g includes a light emitting structure 120 that includes a first conductive type semiconductor layer 121, an active layer 123 and a second conductive type semiconductor layer 125, a first contact electrode 130, a second contact electrode 140, first and second insulation layers 150 and 160, a first bulk electrode 171, a second bulk electrode 173, an insulation support layer 180, connection layers 211 and 213, and electrode pads 231 and 233. The light emitting device 100g may further include a growth substrate (not shown) and a wavelength conversion portion (not shown).

The connection layers 211 and 213 may be disposed on the first bulk electrode 171 and the second bulk electrode 173, respectively.

The connection layers 211 and 213 may include a first connection layer 211 and a second connection layer 213. The first connection layer 211 and the second connection layer 213 are disposed on the first bulk electrode 171 and the second bulk electrode 173 and are electrically connected thereto, respectively. In this exemplary embodiment, the insulation support layer 180 may include a lower insulation support layer 181 and an upper insulation support layer 183. The lower insulation support layer 181 covers side surfaces of the first and second bulk electrodes 171 and 173 and the upper insulation support layer 183 partially covers upper surfaces of the first and second bulk electrodes 171 and 173. The upper insulation support layer 183 may include openings, through which the upper surfaces of the first and second bulk electrodes 171 and 173 are partially exposed. The openings partially exposing the upper surfaces of the first and second bulk electrodes 171 and 173 may be at least partially filled with the connection layers 211 and 213. Upper surfaces of the upper insulation support layer 183, the first connection layer 211 and the second connection layer 213 may be generally flush with each other to constitute a coplanar surface.

The first connection layer 211 and the second connection layer 213 may include an electrically conductive metal, a conductive oxide, or a conductive nitride, and particularly, may be formed of a metal having high electrical conductivity, such as Au, Ag, Cu, Ni, Pt, and the like. The first electrode pad 231 and the second electrode pad 233 may be disposed on the connection layers 211 and 213 and electrically connected to the bulk electrodes 171 and 173 through the connection layers 211 and 213, respectively. Specifically, the first and second electrode pads 231 and 233 may be electrically connected to the first and second bulk electrodes 171 and 173 by the first and second connection layers 211 and 213, respectively.

The first electrode pad 231 and the second electrode pad 233 allow the light emitting device 100g to be more stably mounted on a separate substrate or the like. For example, when the first and second bulk electrodes 171 and 173 include sintered Cu or Ag particles, the first and second bulk electrodes 171 and 173 exhibit poor wettability with respect to solder, and the like. Accordingly, with a structure in which the first and second electrode pads are disposed on the insulation support layer 180, the light emitting device 100g may be stably mounted on the separate substrate.

The first electrode pad 231 may have a smaller horizontal cross-sectional area than the first bulk electrode 171 and the second electrode pad 233 may have a larger horizontal cross-sectional area than the second bulk electrode 173. The horizontal cross-sectional area of the first electrode pad 231 may be substantially the same as that of the second electrode pad 233.

In a structure in which the horizontal cross-sectional area of the first bulk electrode 171 is much larger than that of the second bulk electrode 173, there may be a problem of failure upon mounting of the light emitting device on a secondary substrate such as a PCB. In order to stably mount such a light emitting device on the secondary substrate, it is necessary to change a conductive pattern of a portion of the secondary substrate on which the light emitting device will be mounted. On the contrary, since the light emitting device 100g according to this exemplary embodiment further includes the first electrode pad 231 and the second electrode pad 233, electrodes on a surface of the light emitting device 100g mounted on the secondary substrate may be formed similarly to those of the light emitting device 100g. Accordingly, the light emitting device 100g according to this exemplary embodiment may be applied to various applications through a general mounting process without addition or change of a process, and may reduce defects in the mounting process.

The first and second electrode pads 231 and 233 may include a conductive material such as a metal. The metal may include Ni, Pt, Pd, Rh, W, Ti, Al, Ag, Sn, Cu, Ag, Bi, In, Zn, Sb, Mg, Pb, and the like.

The upper insulation support layer 183 may have a thickness of about 10 μm or less, thereby preventing deterioration in heat dissipation efficiency upon dissipation of heat from the first and second bulk electrodes 171 and 173 through the upper insulation support layer 183.

Figure 13A:
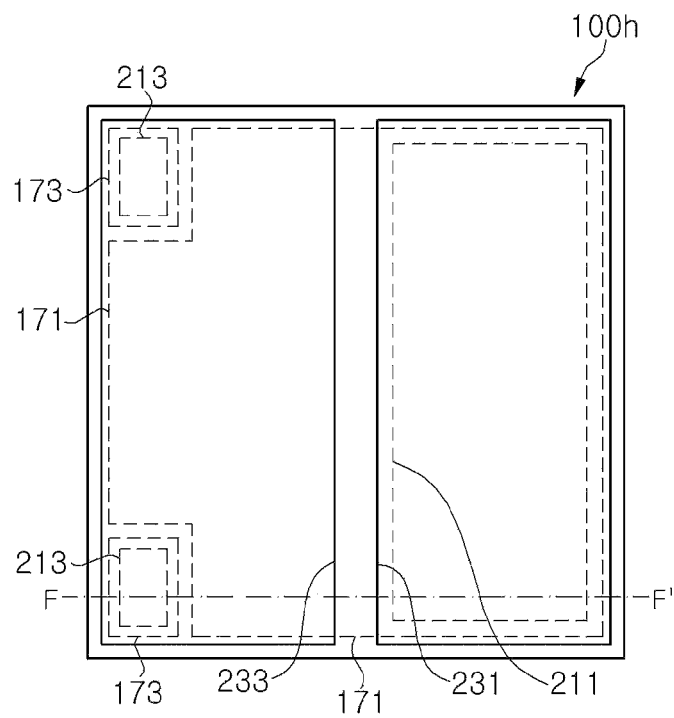
FIGS. 13a, 13b, and 14 are plan views and a cross-sectional view, respectively, of a light emitting device according to yet another exemplary embodiment.
Figure 13B:
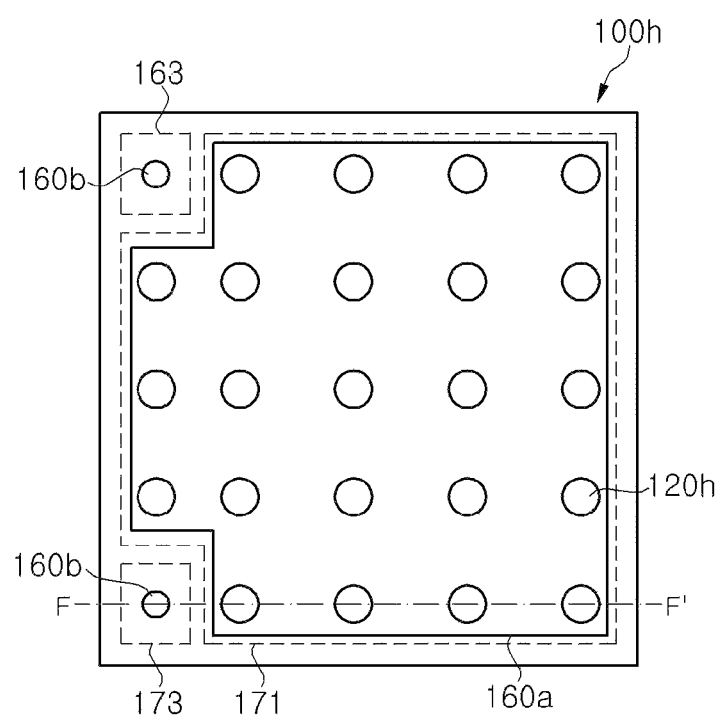
Figure 14:
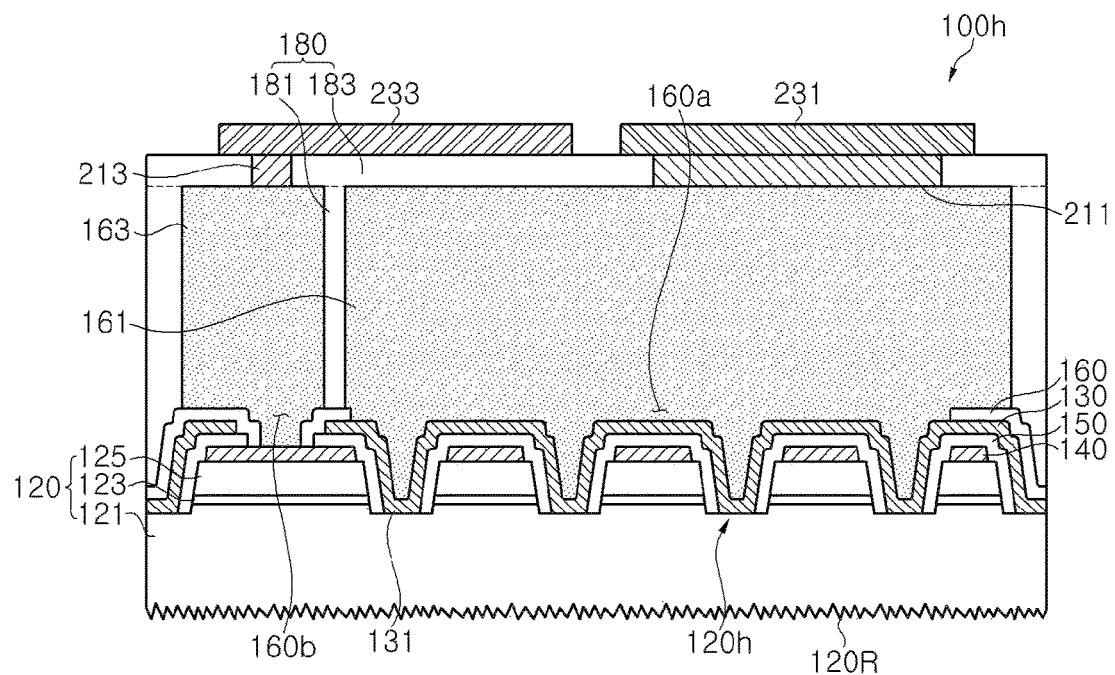

FIGS. 13a, 13b, and 14 are plan views and a cross-sectional view, respectively, of a light emitting device according to yet another exemplary embodiment.

A light emitting device 100h according to the exemplary embodiment shown in FIGS. 13a, 13b, and 14 is generally similar to the light emitting device 100d shown in FIGS. 11a, 11b, and 12, and further includes a plurality of second bulk electrodes 173. Hereinafter, different features of the light emitting device 100h according to this exemplary embodiment will be mainly described, and detailed descriptions of the same components will be omitted.

FIG. 13a is a plan view of the light emitting device 100h, FIG. 13b is a plan view illustrating locations of holes 120h, a third opening 160a and fourth openings 160b, and FIG. 14 is a cross-sectional view taken along line F-F' of FIG. 13a and FIG. 13b.

Referring to FIGS. 13a, 13b, and 14, the light emitting device 100h includes a light emitting structure 120 including a first conductive type semiconductor layer 121, an active layer 123 and a second conductive type semiconductor layer 125, a first contact electrode 130, a second contact electrode 140, first and second insulation layers 150 and 160, a first bulk electrode 171, a second bulk electrode 173, an insulation support layer 180, a connection layer 210, and electrode pads 231 and 233. The light emitting device 100h may further include a growth substrate (not shown) and a wavelength conversion portion (not shown).

The light emitting device 100h may further include a plurality of second bulk electrodes 173. With this structure, the light emitting device 100h has a greater number of holes 120h, a larger area of the third opening 160a, and a larger horizontal cross-sectional area of the first bulk electrode 171 than the light emitting device 100g shown in FIGS. 11a, 11b, and 12. The second bulk electrodes 173 may be separated from each other and some of the holes 120h may be disposed between the second bulk electrodes 173.

According to this exemplary embodiment, the horizontal cross-sectional area of the first bulk electrode 171 is further increased, whereby the light emitting device 100h may achieve further improvement in heat dissipation efficiency and luminous characteristics.

On the other hand, the light emitting device 100h may omit the electrode pads 231 and 233.

Figure 15:
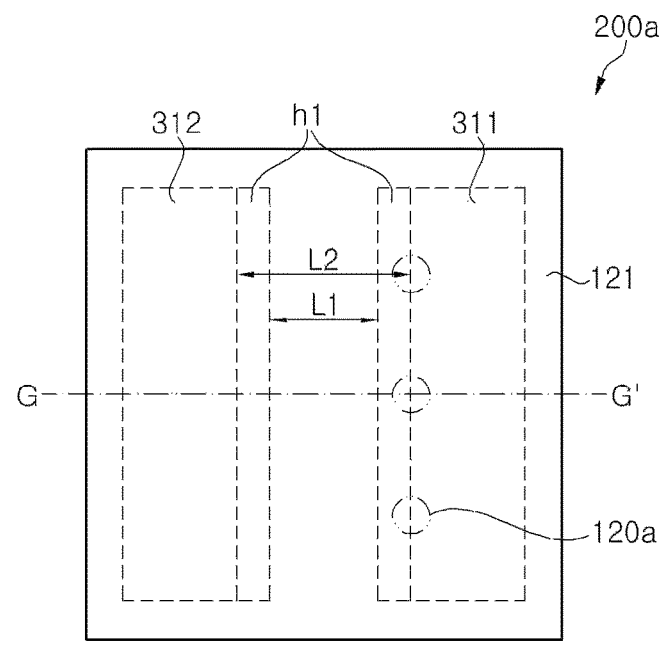
FIGS. 15 and 16 are a plan view and a cross-sectional view, respectively, of a light emitting device according to yet another exemplary embodiment.
Figure 16:
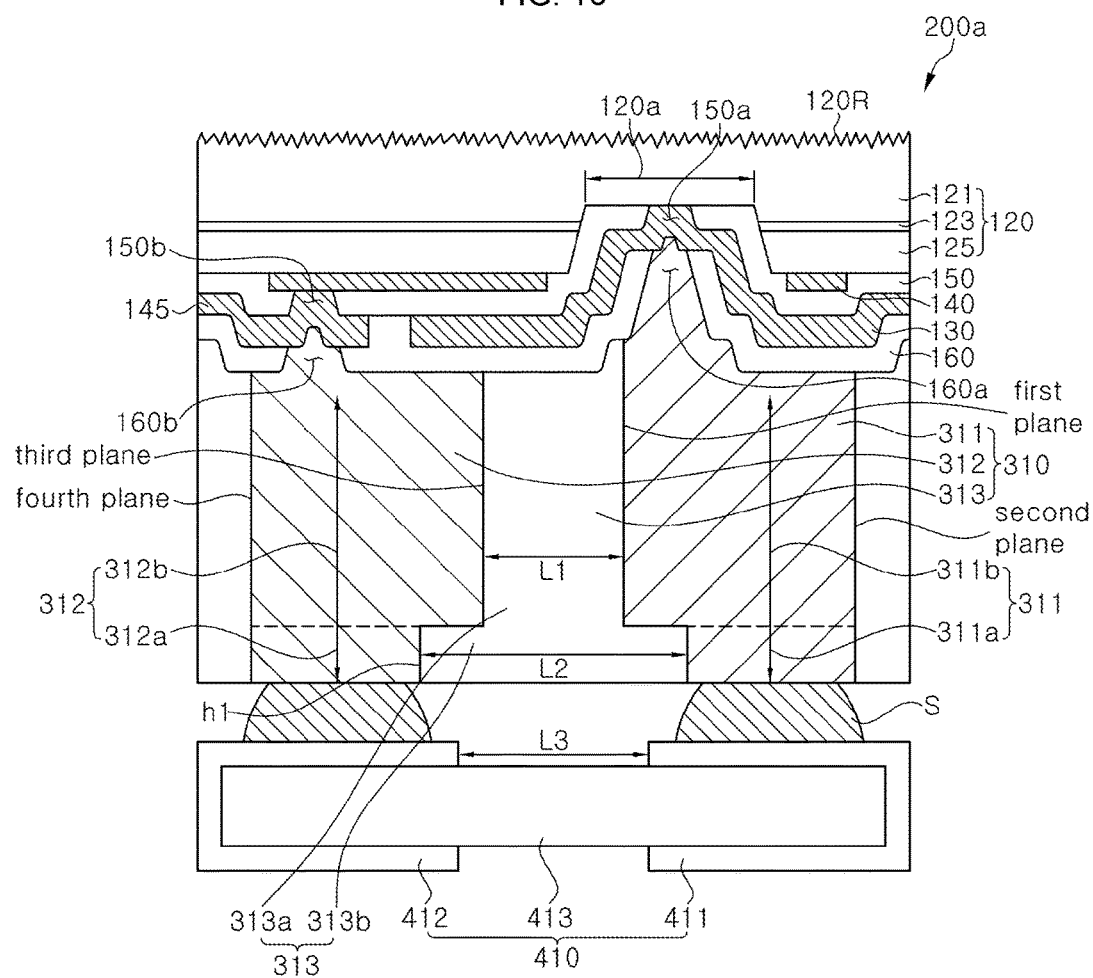

FIGS. 15 and 16 are a plan view and a cross-sectional view, respectively, of a light emitting device 200a according to yet another exemplary embodiment. FIG. 16 is a cross-sectional view taken along line G-G' of FIG. 15. Detailed descriptions of the substantially same components as those of the exemplary embodiments described above will be omitted.

Referring to FIGS. 15 and 16, the light emitting device 200a includes a light emitting structure 120, a first contact electrode 130, a second contact electrode 140, a support structure 310, and a substrate 410. The light emitting device may further include a growth substrate (not shown) and a connection electrode 145.

The light emitting structure 120 includes a first conductive type semiconductor layer 121, an active layer 123 disposed on the first conductive type semiconductor layer 121, and a second conductive type semiconductor layer 125 disposed on the active layer 123.

The light emitting structure 120 may include a partially exposed region of the first conductive type semiconductor layer 121 formed by partially removing the second conductive type semiconductor layer 125 and the active layer 123. For example, as shown in FIG. 15, the light emitting structure 120 may include at least one hole 120a formed through the second conductive type semiconductor layer 125 and the active layer 123 to expose the first conductive type semiconductor layer 121 therethrough. The light emitting structure 120 may include a plurality of holes 120a, and the shape and arrangement of the holes 120a are not limited to those shown in the drawings.

The light emitting structure 120 may further include a roughness 120R. The roughness 120R may be formed by at least one of dry etching, wet etching and electrochemical etching. For example, the roughness 120R may be formed by PEC etching or by wet etching in an etching solution containing KOH and NaOH.

The light emitting structure 120 may further include a growth substrate (not shown) disposed on an upper surface of the first conductive type semiconductor layer 121. Such a growth substrate may be removed from the light emitting structure 120 by a typical method known in the art after fabrication of the light emitting device.

The second contact electrode 140 may be disposed on the second conductive type semiconductor layer 125 and electrically connected thereto. The second contact electrode 140 may at least partially cover a lower surface of the second conductive type semiconductor layer 125. Alternatively, the second contact electrode 140 may be disposed to cover the overall lower surface of the second conductive type semiconductor layer 125. The second contact electrode 140 may be formed as a monolithic layer in a region covering the lower surface of the second conductive type semiconductor layer 125 excluding a region in which the exposed region of the first conductive type semiconductor layer 121 of the light emitting structure 120 (for example, the holes 120*a*) is formed. With this structure, the light emitting device may allow a uniform supply of electric current to the entire region of the light emitting structure 120, thereby improving current spreading efficiency. However, it should be understood that the present disclosure is not limited thereto. Alternatively, the second contact electrode 140 may be composed of a plurality of unit electrodes separated from each other.

The first contact electrode 130 may be electrically connected to the first conductive type semiconductor layer 121. The first contact electrode 130 may be electrically connected to the first conductive type semiconductor layer 121 through the exposed region of the first conductive type semiconductor layer 121, for example, the holes 120*a*. The first contact electrode 130 may be disposed on the overall upper surface of the light emitting structure. With this structure, the first contact electrode 130 may be insulated from the second contact electrode 140 through an insulation layer such as a first insulation layer 150 described below.

Referring to FIG. 16, the light emitting device 200*a* according to this exemplary embodiment may further include the first insulation layer 150. The first insulation layer 150 may cover a lower surface of the light emitting structure 120 and lower and side surfaces of the second contact electrode 140, and may be disposed between the light emitting structure 120 and the first contact electrode 130 to insulate the first contact electrode 130 from the second contact electrode 140. The first insulation layer 150 may include openings 150*a* and 150*b* formed at certain locations to achieve electrical connection to the first conductive type semiconductor layer 121 and the second conductive type semiconductor layer 125. For example, the first insulation layer 150 includes openings 150*a* which expose the first conductive type semiconductor layer 121 and openings 150*b* which expose the second contact electrode 140. The first insulation layer 150 may be formed of an oxide such as $SiO_2$, a nitride such as $SiN_x$, or an insulating material such as $MgF_2$ by chemical vapor deposition (CVD) and the like. The first insulation layer 150 may be composed of a single layer or multiple layers. Furthermore, the first insulation layer 150 may include a distributed Bragg reflector (DBR) in which a low refractivity material layer and a high refractivity material layer are alternately stacked one above another.

Referring to FIG. 16, the light emitting device 200*a* according to this exemplary embodiment may further include a second insulation layer 160. The second insulation layer 160 may more effectively prevent disconnection of the first contact electrode 130 and the second contact electrode 140 while acting to protect the light emitting structure from external contaminants or impact. The second insulation layer 160 may cover a portion of the first contact electrode 130. The second insulation layer 160 may include an opening 160*a* which exposes the first contact electrode 130 and openings 160*b* which expose the second contact electrode 140. Sidewalls of the first contact electrode 130 may be covered by the second insulation layer 160. The second insulation layer 160 may be prepared by depositing an oxide insulation layer, a nitride insulation layer or a polymer such as polyimides, Polytetrafluoroethylene (PTFE), or a poly(p-xylylene) polymer, on the first contact electrode 130, followed by patterning.

The support structure 310 may include a first bulk electrode 311, a second bulk electrode 312, and an insulation support layer 313. The first bulk electrode 311, the second bulk electrode 312 and the insulation support layer 313 according to this exemplary embodiment may correspond to the first bulk electrode 171, the second bulk electrode 173 and the insulation support layer 180 according to the exemplary embodiments described above.

The first bulk electrode 311 and the second bulk electrode 312 may be disposed on the light emitting structure 120 and separated from each other and disposed on the first contact electrode 130 and the second contact electrode 140, respectively. The first and second bulk electrodes 311 and 312 may be formed of a metallic material and generally have a greater thickness than that of the light emitting structure 120. The first bulk electrode 311 and the second bulk electrode 312 may be electrically connected to the first contact electrode 130 and the second contact electrode 140, respectively, and thus may be electrically connected to the first conductive type semiconductor layer 121 and the second conductive type semiconductor layer 125, respectively. The first and second bulk electrodes 311 and 312 enable efficient dissipation of heat generated from the light emitting structure 120 and may include a material having a similar coefficient of thermal expansion to the coefficient of thermal expansion of the light emitting structure 120.

The first bulk electrode 311 and the second bulk electrode 312 may be thicker than the first contact electrode 130 and the second contact electrode 140 in order to facilitate heat dissipation. Specifically, the thicknesses of the first bulk electrode 311 and the second bulk electrode 312 may be 5 times to 20 times the thicknesses of the first contact electrode 130 and the second contact electrode 140, respectively. With this structure, the light emitting device may allow efficient dissipation of heat generated from the light emitting structure 120 to the outside through side surfaces of the first bulk electrode 311 and the second bulk electrode 312, thereby minimizing or preventing cracking or failure due to heat.

The first bulk electrode 311 may include a lower region 311*a* and an upper region 311*b*, and the second bulk electrode 312 may include a lower region 312*a* and an upper region 312*b*. Each of the first bulk electrode 311 and the second bulk electrode 312 may be formed as a monolithic layer. Referring to FIG. 16, the lower region 311*a* of the first bulk electrode 311 and the lower region 312*a* of the second bulk electrode 312 may be disposed near a substrate 410 described below, and the upper region 311*b* of the first bulk electrode 311 and the upper region 312*b* of the second bulk electrode 312 may be disposed near the light emitting structure 120. The lower regions 311*a* and 312*a* may include lower surfaces of the first bulk electrode 311 and the second bulk electrode 312, respectively. Specifically, lower surfaces of the lower regions 311*a* and 312*a* may be coincident with the lower surfaces of the first and second bulk electrodes 311 and 312. With this structure, the light emitting device may prevent disconnection of the first and second bulk electrodes 311 and 312, and may achieve an improvement in adhering to the substrate 410 through adjustment of the configuration of the lower regions 311*a* and 312*a* without formation of separate layers on the lower surfaces of the first bulk electrode 311 and the second bulk electrode 312.

The lower region 311*a* and the upper region 311*b* of the first bulk electrode 311 may correspond to the first bulk electrode 171 and the first pad electrode 191 according to the exemplary embodiments described above, respectively. Similarly, the lower region 312*a* and the upper region 312*b* of the second bulk electrode 312 may correspond to the second bulk electrode 173 and the second pad electrode 193 according to the exemplary embodiments described above, respectively. The lower region 311*a* or 312*a* may be formed of a different material from the upper region 311*b* or 312*b*.

A distance $L_2$ between the lower region 311a of the first bulk electrode and the lower region 312a of the second bulk electrode may be greater than a distance $L_1$ between the upper region 311b of the first bulk electrode and the upper region 312b of the second bulk electrode. Since the distance $L_1$ between the upper regions 311b, 312b is relatively short, heat generated from the light emitting structure 120 may be efficiently dissipated through the side surfaces of the first bulk electrode 311 and the second bulk electrode 312. With this structure, cracking or damage to the light emitting device due to heat may be minimized or prevented from occurring. Since the distance $L_2$ between the lower regions 311a and 312a is relatively long, it is possible to prevent disconnection of the first and second bulk electrodes 311 and 312 due to an adhesive material such as solder when the first and second bulk electrodes 311 and 312 are mounted on the substrate 410 through solder bonding or eutectic bonding. With this structure, the light emitting device may ensure electrical stability.

The first bulk electrode 311 may include a first plane facing the second bulk electrode 312 and a second plane disposed opposite the first plane; the second bulk electrode 312 may include a third plane facing the first bulk electrode 311 and a fourth plane disposed opposite the third plane. The first and second bulk electrodes 311 and 312 may include a first depression $h_1$ inset from lower edges of the first plane and the third plane, respectively. Referring to FIG. 16, the first depression $h_1$ may be constituted by a plurality of planes. Specifically, the first depression $h_1$ may include planes parallel to the first plane and the third plane of the first and second bulk electrodes 311 and 312, and planes parallel to lower surfaces of the first and second bulk electrodes 311 and 312. With the depression structure described above, the first depression $h_1$ may be filled with an insulation support layer 313 described below, thereby preventing an adhesive material such as solder from flowing into a space between the first and second bulk electrodes 311 and 312. Accordingly, it is possible to prevent the first and second bulk electrodes 311 and 312 from being disconnected by the adhesive material. Contact regions between the first and second bulk electrodes 311 and 312 and the insulation support layer 313 may be increased, thereby improving adhesion between the first and second bulk electrodes 311 and 312 and the insulation support layer. With this structure, the light emitting device may ensure mechanical stability. The first depression h1 may be formed by an etching process using a photoresist, without being limited thereto.

The distance $L_1$ between the upper regions 311b and 312b may be 100 μm or less. Within this range, heat dissipation from the first and second bulk electrodes 311 and 312 may be further improved. The distance $L_2$ between the lower regions 311a and 312a may be 250 μm or more. Within this range, it is possible to effectively prevent disconnection of the first and second bulk electrodes 311 and 312 by the adhesive material such as solder.

The insulation support layer 313 may be disposed between the first and second bulk electrodes 311 and 312. The insulation support layer 313 may include an upper insulation support layer 313a and a lower insulation support layer 313b. The upper insulation support layer 313a and the lower insulation support layer 313b according to this exemplary embodiment may correspond to the lower insulation support layer 181 and the upper insulation support layer 183, respectively. The insulation support layer 313 insulates the first and second bulk electrodes 311 and 312 from each other, thereby insulating the first contact electrode 130 and the second contact electrode 140 from each other, and fills the space between the first and second bulk electrodes 311 and 312 to improve durability while relieving stress caused by thermal expansion of the first and second bulk electrodes 311 and 312. In addition, as shown in FIG. 16, the insulation support layer 313 may be configured to surround not only the space between the first and second bulk electrodes 311 and 312, but also the entirety of the side surfaces of the first and second bulk electrodes 311, 312. With this structure, the light emitting device may be protected from external contaminants or impact. The insulation support layer 313 may include an epoxy molding compound (EMC). The insulation support layer 313 may be coated to cover the lower surfaces of the first and second bulk electrodes 311 and 312. In this exemplary embodiment, a lower surface of the insulation support layer 313 may be flattened by lapping or chemical mechanical polishing, and the first and second bulk electrodes 311 and 312 may be exposed.

The substrate 410 may be disposed adjacent to the support structure 310. The substrate 410 may include a first interconnection portion 411 electrically connected to the first bulk electrode 311 and a second interconnection portion 412 electrically connected to the second bulk electrode 312. The first interconnection portion 411 and the second interconnection portion 412 may be disposed on a base 413 of the substrate 410, without being limited thereto. The first and second interconnection portions 411 and 412 may include a material having high electrical conductivity such as Cu, Au, Ag, Pt, Al, and the like. The base 413 of the substrate 410 may include a ceramic material and may include a metallic material in order to improve heat dissipation of the light emitting device. The first and second bulk electrodes 311 and 312 may be mounted on the substrate 410 through solder bonding or eutectic bonding, without being limited thereto. For example, for solder bonding, solder S may be disposed between the first bulk electrode 311 and the first interconnection portion 411 and between the second bulk electrode 312 and the second interconnection portion 412.

A distance $L_3$ between the first interconnection portion 411 and the second interconnection portion 412 may be greater than the distance $L_1$ between the upper regions 311b and 312b. Since the distance $L_3$ between the first interconnection portion 411 and the second interconnection portion 412 is relatively long, it is possible to prevent disconnection of the first and second bulk electrodes 311 and 312 due to an adhesive material such as solder when the first and second bulk electrodes 311 and 312 are mounted on the substrate 410 through solder bonding or eutectic bonding. With this structure, the light emitting device may ensure electrical stability.

Figure 17:
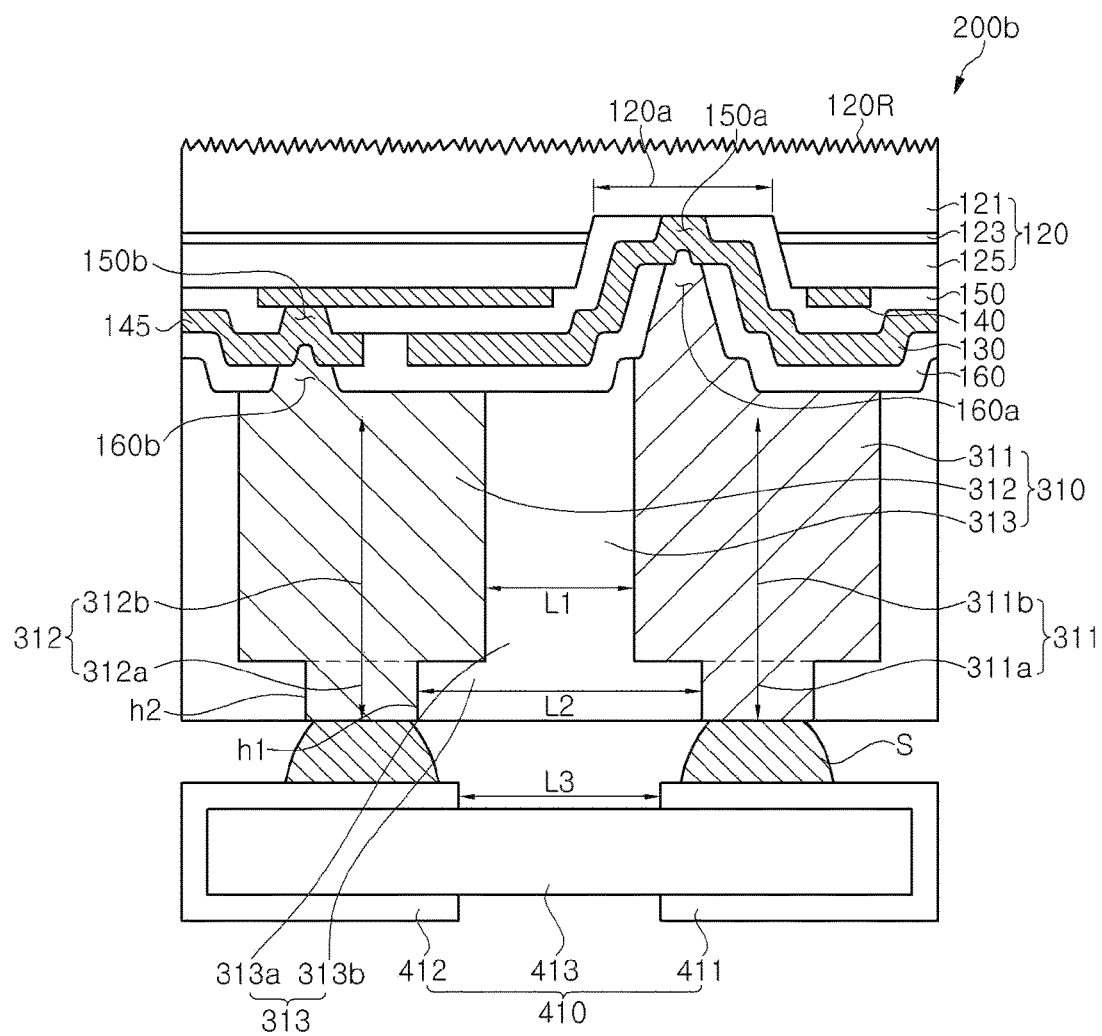
FIG. 17 is a sectional view of a light emitting device according to yet another exemplary embodiment.

FIG. 17 is a sectional view of a light emitting device according to yet another exemplary embodiment. The light emitting device shown in FIG. 17 is generally similar to the light emitting device shown in FIGS. 15 and 16, and further includes a second depression $h_2$ inset from lower edges of the second plane of the first bulk electrode 311 and the fourth plane of the second bulk electrode 312. Referring to FIG. 17, the second depression $h_1$ may be constituted by a plurality of planes. Specifically, the second depression $h_2$ may include planes parallel to the second plane and the fourth plane of the first and second bulk electrodes 311 and 312, and planes parallel to the lower surfaces of the first and second bulk electrodes 311 and 312. With the depression structure described above, the second depression $h_2$ may be filled with an insulation support layer 313 described below, thereby preventing an adhesive material such as solder from flowing towards an outer surface of the light emitting device. Accordingly, it is possible to prevent the first and second bulk electrodes 311 and 312 from being disconnected by the adhesive material. Contact regions between the first and second bulk electrodes 311 and 312 and the insulation support layer 313 may be further increased, thereby improving adhesion between the first and second bulk electrodes 311 and 312 and the insulation support layer. With this structure, the light emitting device may ensure mechanical stability.

Figure 18:
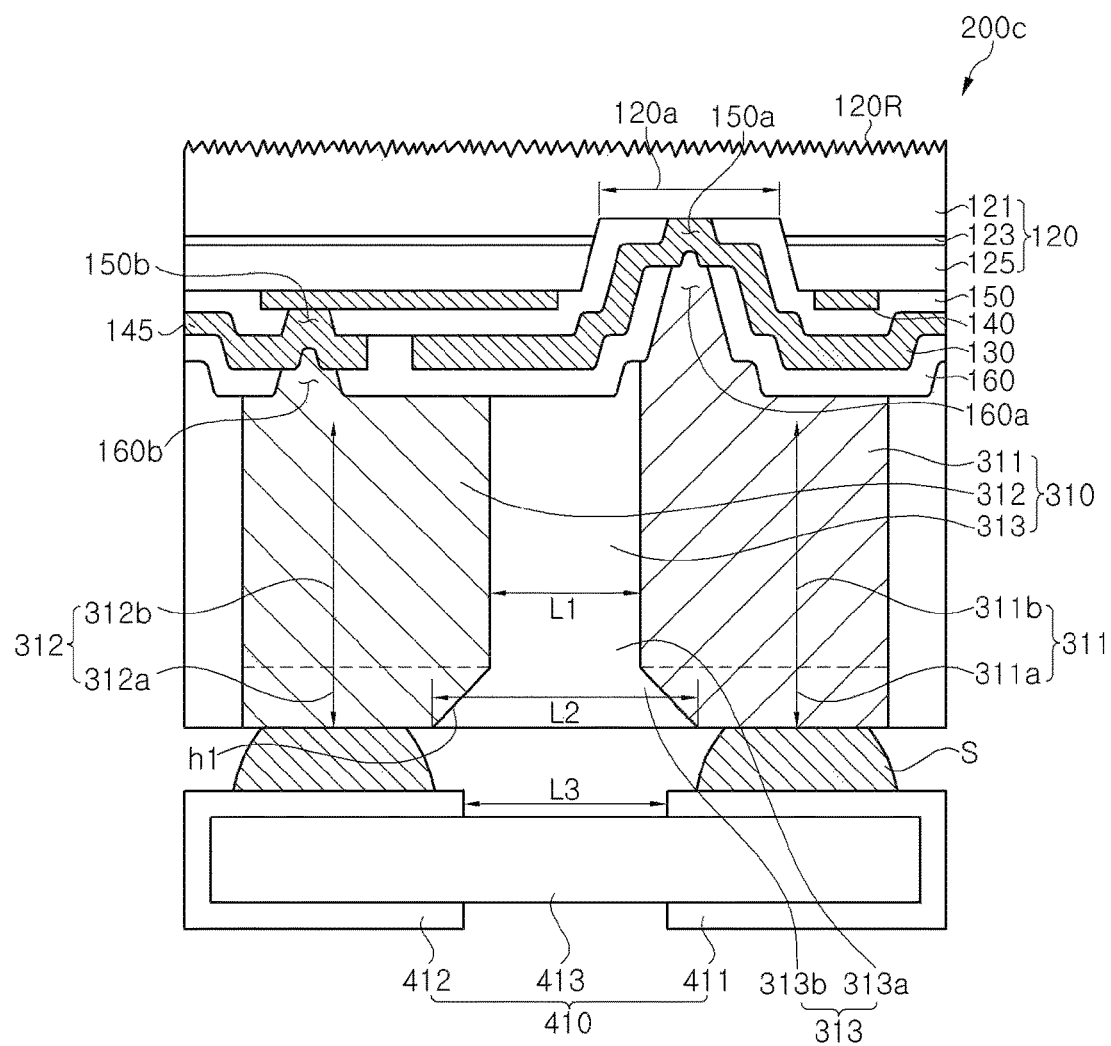
FIG. 18 is a sectional view of a light emitting device according to yet another exemplary embodiment.
Figure 19:
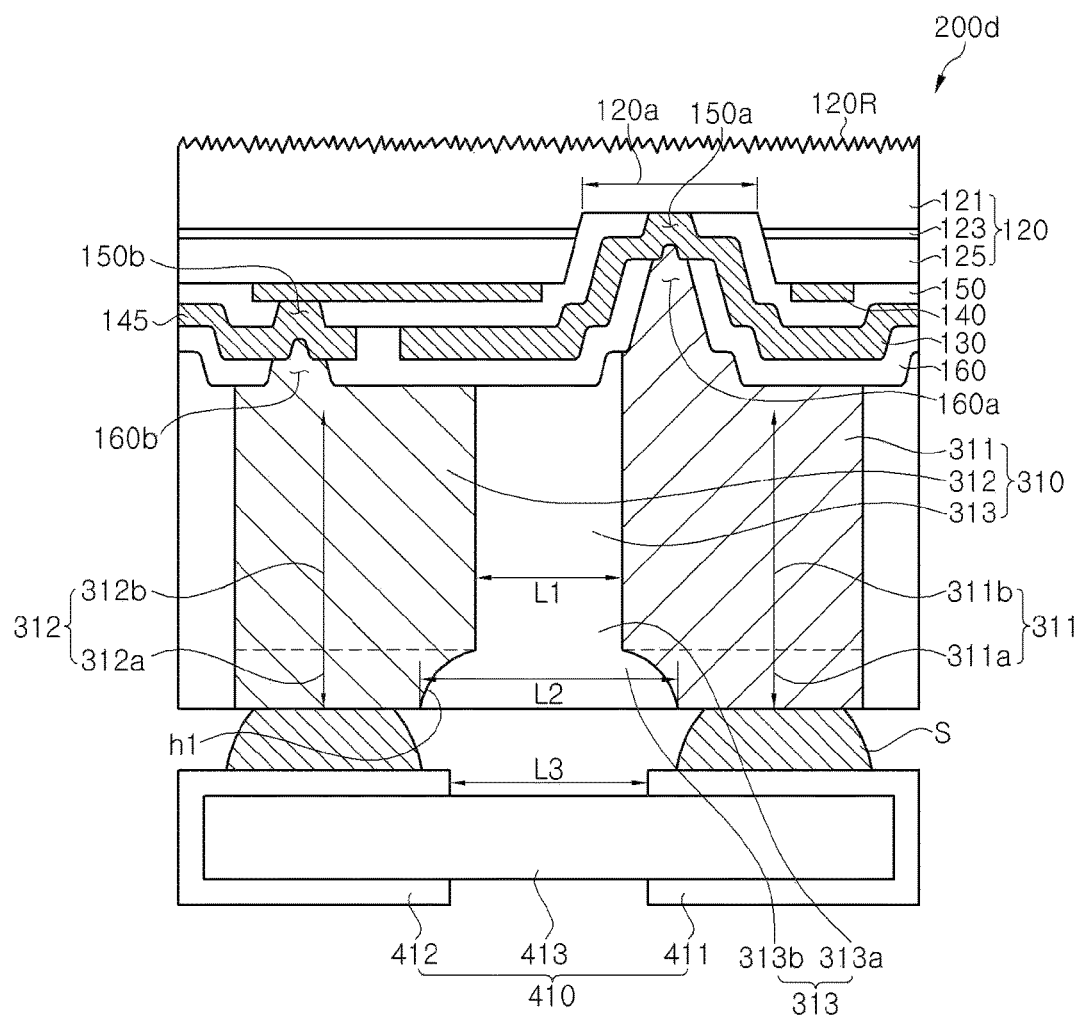
FIG. 19 is a sectional view of a light emitting device according to yet another exemplary embodiment.

FIGS. 18 and 19 are sectional views of light emitting devices according to other exemplary embodiments. The light emitting devices shown in FIGS. 18 and 19 are generally similar to the light emitting device shown in FIGS. 15 and 16 except that the first depression h1 is composed of a single plane or a concave plane. Specifically, the first depression $h_1$ of the light emitting device shown in FIG. 18 may be formed as a single, chamfered planar surface. The first depression $h_1$ of the light emitting device shown in FIG. 19 may be formed in a concave shape, the inclination of which gradually increases towards the lower surfaces of the first and second bulk electrodes 311 and 312. Alternatively, although not shown in the drawings, the first depression $h_1$ may be composed of a convex plane. Specifically, the first depression $h_1$ may be formed in a convex shape, the inclination of which gradually decreases towards the lower surfaces of the first and second bulk electrodes 311 and 312. With this structure, since the distance between the first and second bulk electrodes 311 and 312 may be gradually decreased, a section capable of dissipating heat from the light emitting device may be increased. At the same time, since the distance between the lower surfaces of the first and second bulk electrodes 311 and 312 may be greater than the distance between the upper regions 311b and 312b, it is possible to prevent disconnection of the first and second bulk electrodes 311 and 312 due to an adhesive material such as solder.

Figure 20:
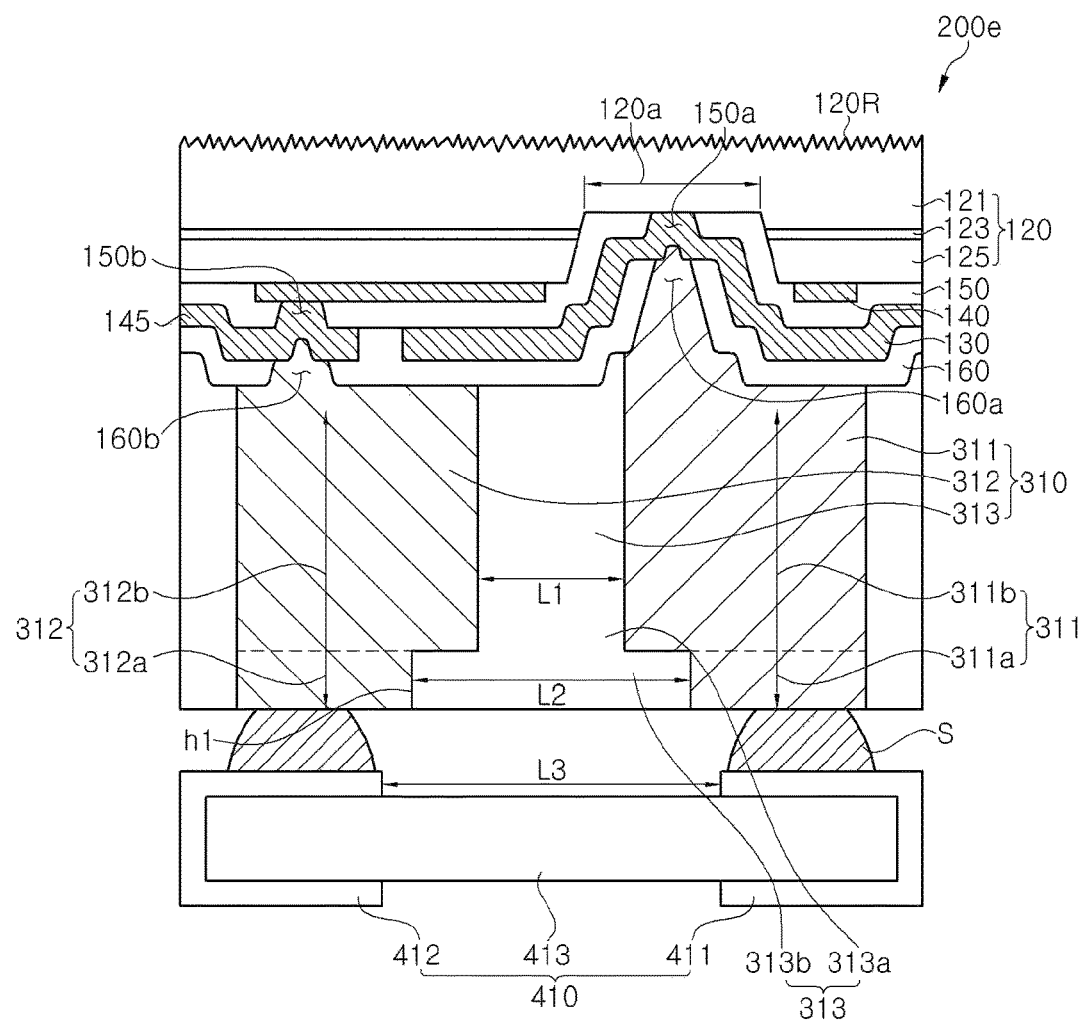
FIG. 20 is a sectional view of a light emitting device according to yet another exemplary embodiment.

FIG. 20 is a sectional view of a light emitting device according to yet another exemplary embodiment. The light emitting device shown in FIG. 20 is generally similar to the light emitting device shown in FIGS. 15 and 16 except that the distance $L_3$ between the first interconnection portion 411 and the second interconnection portion 412 may be greater than the distance $L_2$ between the lower regions 311a and 312a. In this structure, since the distance $L_3$ between the first interconnection portion 411 and the second interconnection portion 412 is relatively long, it is possible to more effectively prevent disconnection of the first and second interconnection portions 411 and 412 due to an adhesive material such as solder when the first and second bulk electrodes 311 and 312 are mounted on the substrate 410 through solder bonding or eutectic bonding. Since the adhesive material may be prevented from flowing into a region between the lower surfaces of the first and second bulk electrodes 311 and 312 along the first and second interconnection portions 411 and 412, disconnection of the first and second bulk electrodes 311, 312 may be more effectively prevented. With this structure, the light emitting device may ensure electrical stability.

Figure 21:
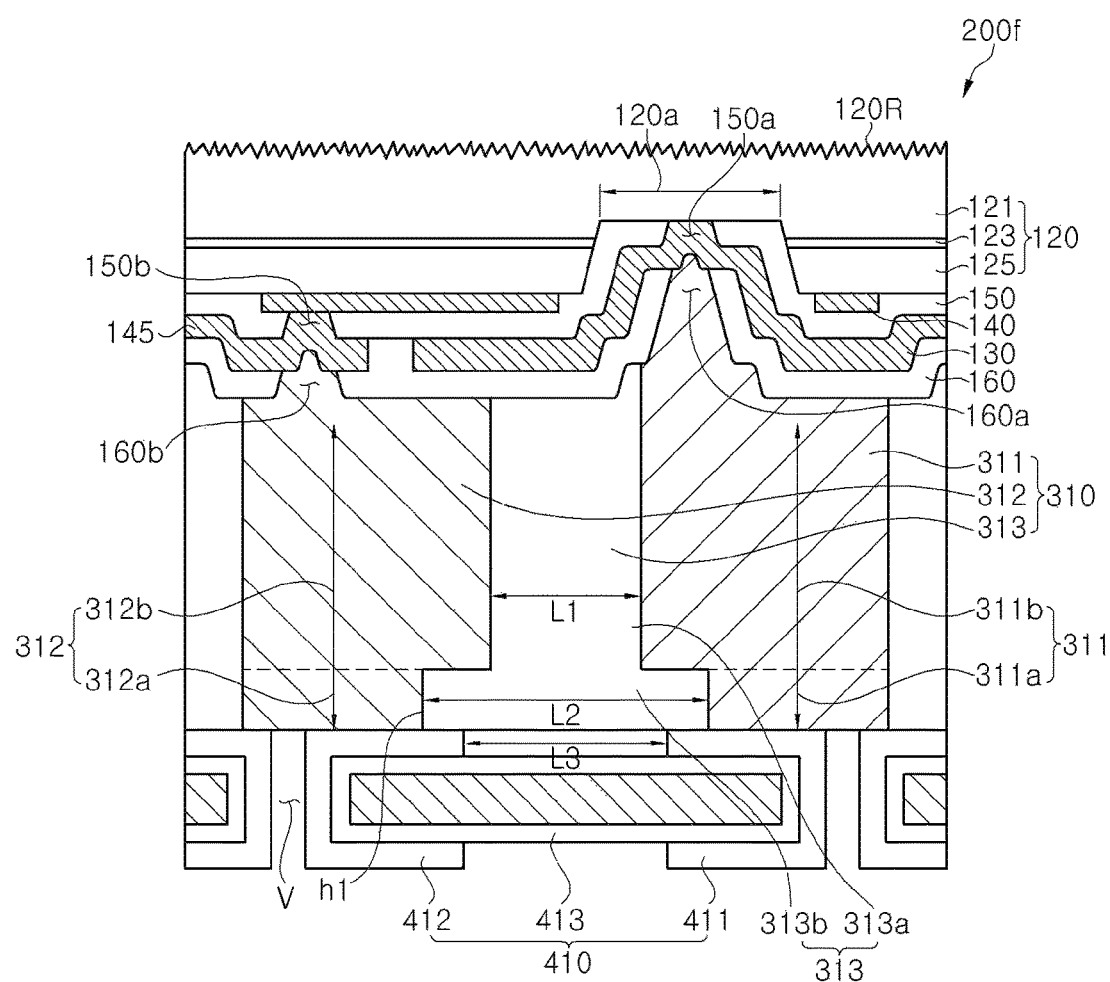
FIG. 21 is a sectional view of a light emitting device according to yet another exemplary embodiment.

FIG. 21 is a sectional view of a light emitting device according to yet another exemplary embodiment. Referring to FIG. 21, a substrate 410 according to this exemplary embodiment further includes a base 413 supporting a first interconnection portion 411 and a second interconnection portion 412. The substrate 410 may include one or more via-holes V formed through the base 413 in position disposed over a first bulk electrode 311 and a second bulk electrode 312, respectively. Specifically, the base 413 may include a ceramic material, without being limited thereto.

Referring to FIG. 21, the base 413 may include a metallic material such as Cu in order to improve heat dissipation of the light emitting device. In this exemplary embodiment, in order to prevent the first interconnection portion 411 and the second interconnection portion 412 from being disconnected through the base 413, an insulating material may be disposed between the first and second interconnection portions 411 and 412 and the base 413. As shown in FIG. 21, an inner surface of the via-hole V may be covered by the first interconnection portion 411 or the second interconnection portion 412. Although the via-hole V is shown as a hollow hole, it should be understood that the present disclosure is not limited thereto. Alternatively, the interior of the via-hole V may be filled with a conductive material. The via-holes V may be disposed to overlap the first bulk electrode 311 and the second bulk electrode 312 in the vertical direction. With this structure, the light emitting device allows heat transferred to the first and second bulk electrodes 311 and 312 to be efficiently dissipated through the internal space of the via-hole V and the first and second interconnection portions 411 and 412 disposed inside the via-hole V. With this structure, cracking or damage to the light emitting device due to heat may be minimized of prevented.

Figure 22:
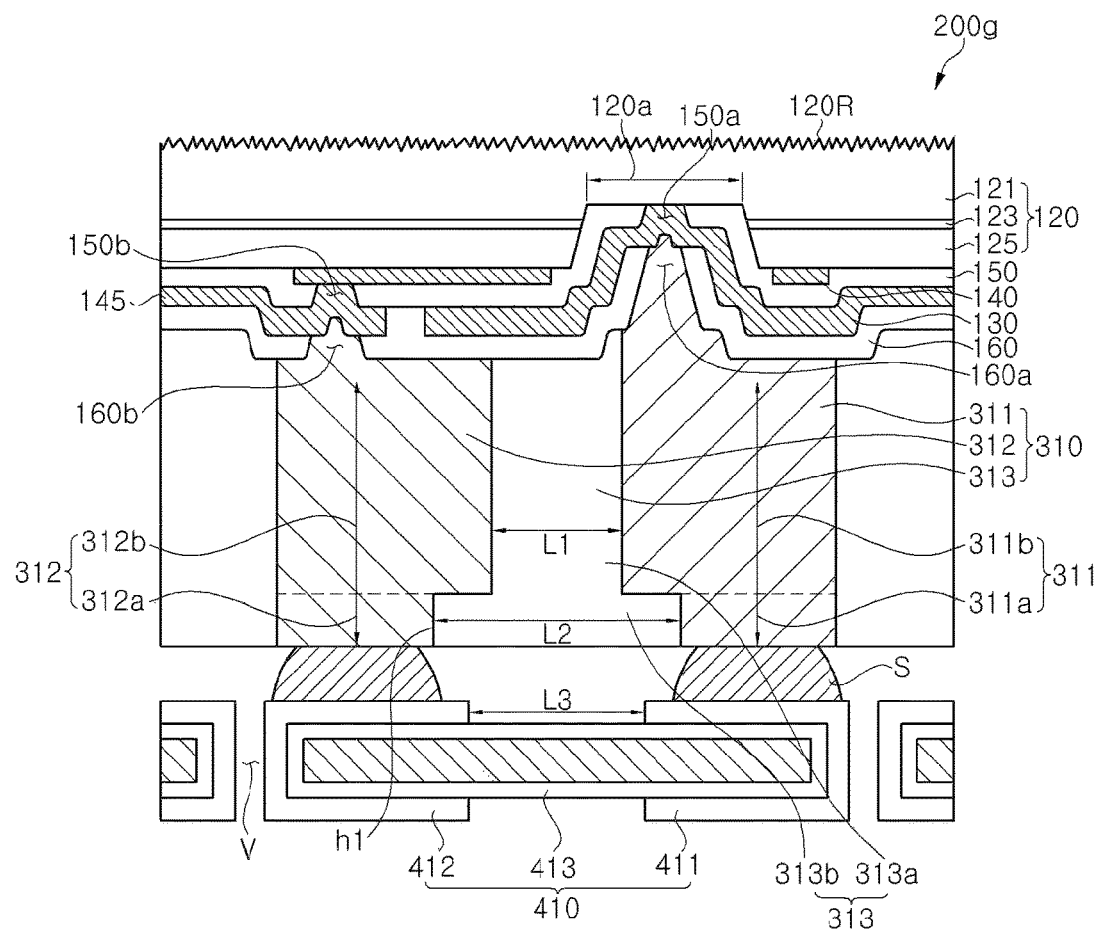
FIG. 22 is a sectional view of a light emitting device according to yet another exemplary embodiment.

FIG. 22 is a sectional view of a light emitting device according to yet another exemplary embodiment. Although the light emitting device shown in FIG. 22 is similar to the light emitting device shown in FIG. 20, there is a difference in that the via-hole Vs do not overlap the first bulk electrode 311 or the second bulk electrode 312 in the vertical direction. According to this exemplary embodiment, it is possible to prevent an adhesive material such as solder from flowing to the outside along the via-hole V during the process of mounting the first bulk electrode 311 and the second bulk electrode 312 on the substrate 410. It is also possible to prevent the first bulk electrode 311 and the second bulk electrode 312 from being damaged by external impact or contaminants through the via-hole V.

Figure 23:
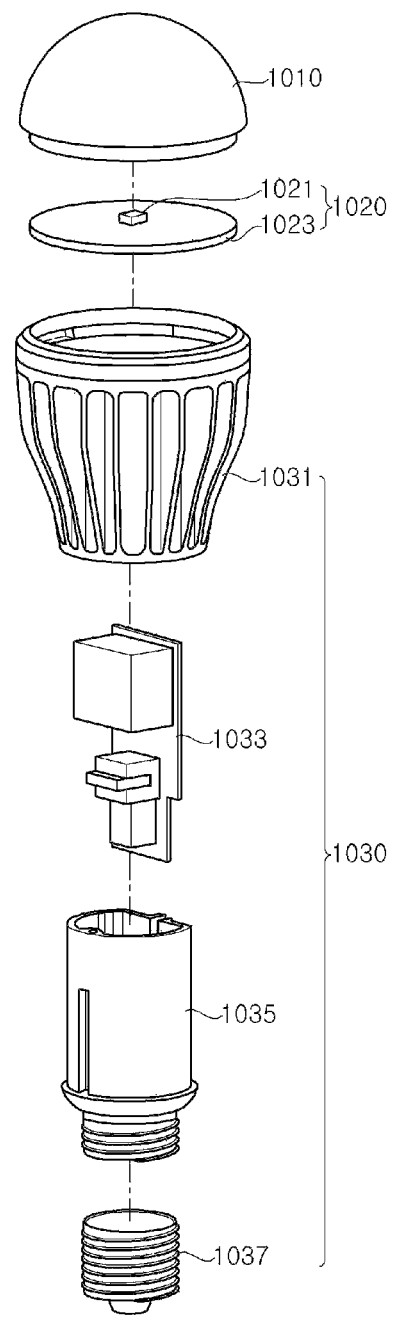
FIG. 23 is an exploded perspective view of an exemplary lighting apparatus in which a light emitting device according to some embodiments of the invention is used.

FIG. 23 is an exploded perspective view of an exemplary lighting apparatus in which a light emitting device according to some embodiments of the invention is used.

Referring to FIG. 23, the lighting apparatus according to this embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection section 1037.

The power supply 1033 may be contained within the power supply case 1035 and be electrically connected to the light emitting diode module 1020, and may include at least one IC chip. The IC chip may regulate, change or control electric power supplied to the light emitting diode module 1020. The power supply case 1035 may include and support the power supply 1033. The power supply case 1035 having the power supply 1033 secured therein may be disposed within the body case 1031. The power source connection section 1037 is disposed at a lower end of the power supply case 1035 and coupled thereto. Accordingly, the power source connection section 1037 is electrically connected to the power supply 1033 within the power supply case 1035 and may serve as a passage through which power may be supplied from an external power source to the power supply 1033.

The light emitting diode module 1020 may include a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. The substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes and the light emitting devices according to the embodiments described above.

The diffusive cover 1010 may be disposed on the light emitting diode 1021 and may be secured to the body case 1031 to cover the light emitting diode 1021. The diffusive cover 1010 may be formed of or include a light-transmitting material, and light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 24:
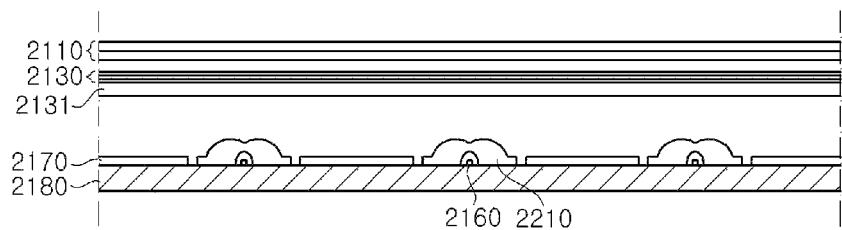
FIG. 24 is a sectional view of an exemplary display device in which a light emitting device according to some embodiments of the invention is used.

FIG. 24 is a sectional view of an exemplary display device in which a light emitting device according to some embodiments of the invention is used.

The display device according to this embodiment may include a display panel 2110, a backlight unit supplying light to the display panel 2110, and a panel guide supporting a lower edge of the display panel 2110.

The display panel 2110 is not particularly limited and may be a liquid crystal panel including a liquid crystal layer. Gate driving PCBs may be further disposed at the edge of the display panel 2110 to supply driving signals to a gate line. Here, the gate driving PCBs 2112 and 2113 may be formed on a thin film transistor substrate instead of being formed on separate PCBs.

The backlight unit may include a light source module, which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. The bottom cover 2180 may be coupled to the panel guide. The substrate may be disposed under the reflective sheet 2170 to be surrounded by the reflective sheet 2170. However, it should be understood that other implementations are also possible. When a reflective material is coated onto a surface thereof, the substrate may be disposed on the reflective sheet 2170. In this embodiment, a plurality of substrates may be arranged parallel to one other. However, it should be understood that other implementations are also possible and the light source module may include a single substrate.

The light emitting diodes 2160 may include at least one of the light emitting diodes and the light emitting devices according to the embodiments described above. The light emitting diodes 2160 may be arranged in a regular pattern in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed on the light emitting devices 2160. Light emitted from the light emitting devices 2160 may be supplied in the form of sheet light to the display panel 2110 through the diffusive plate 2131 and the optical sheets 2130.

The light emitting diodes may be applied to direct type displays like the display according to this embodiment.

Figure 25:
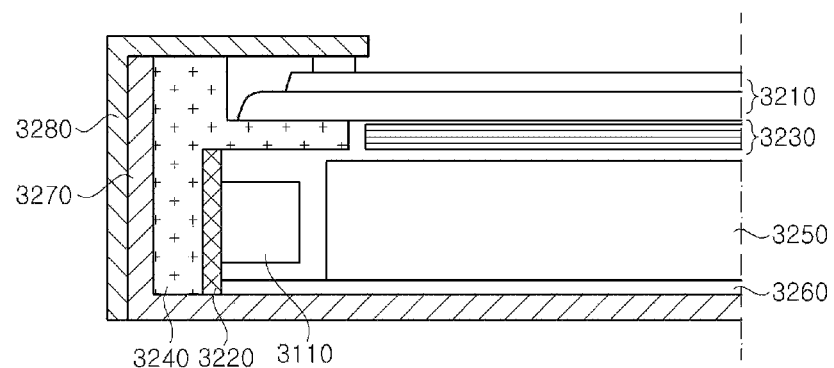
FIG. 25 is a sectional view of an exemplary display device in which a light emitting device according to some embodiments of the invention is used.

FIG. 25 is a sectional view of an exemplary display device in which a light emitting device according to some embodiments of the invention is used.

The display device according to this embodiment includes a display panel 3210 on which an image is displayed, and a backlight unit disposed at a rear side of the display panel 3210 and emitting light thereto. The display device may include a frame 240 supporting the display panel 3210 and receiving the backlight unit, and covers 3240 and 3280 surrounding the display panel 3210.

The display panel 3210 is not particularly limited and may be or include, for example, a liquid crystal panel including a liquid crystal layer. A gate driving PCB may be further disposed at an edge of the display panel 3210 to supply driving signals to a gate line. Here, the gate driving PCB may be formed on a thin film transistor substrate instead of being formed on a separate PCB. The display panel 3210 may be secured by the covers 3240 and 3280 disposed at upper and lower sides thereof, and the cover 3280 disposed at the lower side of the display panel 3210 may be coupled to the backlight unit.

The backlight unit supplying light to the display panel 3210 may include a lower cover 3270 partially open at an upper side thereof, a light source module disposed at one side inside the lower cover 3270, and a light guide plate 3250 disposed parallel to the light source module and converting spot light into sheet light. The backlight unit according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module may include a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board.

The light emitting diodes 3110 may include at least one of the light emitting diodes and the light emitting devices according to the embodiments of the present disclosure described above. Light emitted from the light source module may enter the light guide plate 3250 and be supplied to the display panel 3210 through the optical sheets 3230. The light guide plate 3250 and the optical sheets 3230 may convert spot light emitted from the light emitting diodes 3110 into sheet light.

The light emitting diodes may be applied to edge type displays like the display according to this embodiment.

Figure 26:
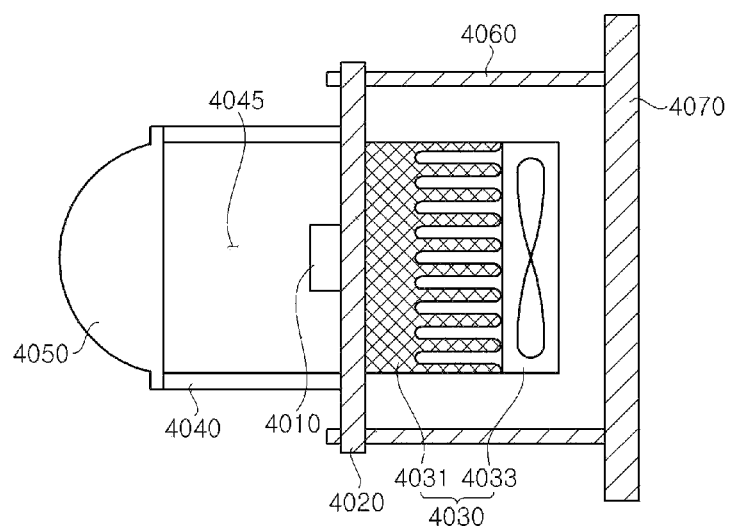
FIG. 26 is a sectional view of an exemplary headlight in which a light emitting device according to some embodiments of the invention is used.

FIG. 26 is a sectional view of an exemplary headlight in which a light emitting device according to some embodiments of the invention is used.

Referring to FIG. 26, the headlight includes a lamp body 4070, a substrate 4020, a light emitting diode 4010, and a cover lens 4050. The headlight may further include a heat dissipation unit 4030, a support rack 4060, and a connection member 4040.

The substrate 4020 may be secured by the support rack 4060 and disposed above the lamp body 4070. As the substrate 4020, any member capable of supporting the light emitting diode 4010 may be used without limitation. The substrate 4020 may be or include a substrate having a conductive pattern, such as a printed circuit board. The light emitting diode 4010 may be disposed on the substrate 4020 and may be supported and secured by the substrate 4020. In addition, the light emitting diode 4010 may be electrically connected to an external power source through the conductive pattern of the substrate 4020. The light emitting diode 4010 may include at least one of the light emitting diodes and the light emitting devices according to the embodiments of the present disclosure described above.

The cover lens 4050 may be disposed on a path of light emitted from the light emitting diode 4010. As shown in the drawing, the cover lens 4050 may be spaced apart from the light emitting diode 4010 by the connection member 4040 and may be disposed in a direction of supplying light emitted from the light emitting diode 4010. By the cover lens 4050, an orientation angle or a color of light emitted by the headlight may be adjusted. The connection member 4040 may be disposed to secure the cover lens 4050 to the substrate 4020 while surrounding the light emitting diode 4010, and thus may act as a light guide that provides a luminous path 4045. The connection member 4040 may be formed of or include a light reflective material or coated therewith. The heat dissipation unit 4030 may include heat dissipation fins 4031 or a heat dissipation fan 4033, and dissipates heat generated upon operation of the light emitting diode 4010.

The light emitting diodes according to the embodiments of the invention may be used in ow with various devices as the skilled artisan will appreciate, including without limitation headlights, particularly, headlights for vehicles.

Although some exemplary embodiments are disclosed herein, it should be understood that these embodiments are not intended to be exclusive. For example, individual structures, elements or features of a particular embodiment are not limited to that particular embodiment and may be applied to other embodiments without departing from the spirit and scope of the invention, which is defined by the appended claims.

What is claimed is:

1. A light emitting device comprising:
    a light emitting structure including a first conductive type semiconductor layer, a second conductive type semiconductor layer disposed on the first conductive type semiconductor layer, and an active layer disposed between the first conductive type semiconductor layer and the second conductive type semiconductor layer;
    a first electrode electrically connected to the first conductive type semiconductor layer;
    a second electrode disposed on and electrically connected to the second conductive type semiconductor layer;
    a support structure comprising a first bulk electrode disposed on and electrically connected to the first electrode, and a second bulk electrode disposed on and electrically connected to the second electrode, and wherein the first bulk electrode and the second bulk electrode are separated from each other with an insulation support layer disposed between the first bulk electrode and the second bulk electrode; and
    a substrate disposed adjacent to the support structure,
    wherein each of the first and second bulk electrodes comprises an upper region and a lower region, with the upper regions of the first and second bulk electrodes being separated from each other by a first distance,
    wherein the substrate includes a first interconnection portion and a second interconnection portion electrically connected to the first bulk electrode and the second bulk electrode, respectively, and separated from each other by a second distance greater than the first distance,
    wherein the first bulk electrode comprises a first plane facing the second bulk electrode and a second plane disposed opposite the first plane,
    wherein the second bulk electrode comprises a third plane facing the first bulk electrode and a fourth plane disposed opposite the third plane,
    wherein the first bulk electrode comprises a first depression inset from a lower most edge of the first plane and defining a lower most edge of the first bulk electrode,
    wherein the second bulk electrode comprises a second depression inset from a lower most edge of the third plane and defining a lower most edge of the second bulk electrode, and
    wherein the insulation support layer is disposed between the lower most edge of the first bulk electrode and the lower most edge of the second bulk electrode such that the insulation support layer extends along the entirety of the lower most edge of the first bulk electrode and the entirety of the lower most edge of the second bulk electrode.

2. The light emitting device of claim 1, wherein the first depression comprises a single substantially planar surface.

3. The light emitting device of claim 1, wherein the first depression comprises a convex or a concave surface.

4. The light emitting device of claim 1, wherein the first depression comprises a plurality of planar surfaces.

5. The light emitting device of claim 1, wherein the first bulk electrode comprises a third depression inset from a lower most edge of the second plane, and
    wherein the second bulk electrode comprises a fourth depression inset from a lower most edge of the fourth plane.

6. The light emitting device of claim 1, wherein the lower regions of the first and second bulk electrodes are separated from each other by a third distance greater than the first distance between the upper regions.

7. The light emitting device of claim 6, wherein the first distance between the upper regions is 100 μm or less.

8. The light emitting device of claim 6, wherein the third distance between the lower regions is 250 μm or less.

9. The light emitting device of claim 1, wherein the lower regions of the first and second bulk electrodes are separated from each other by a third distance and the second distance between the first and the second interconnection portions is greater than the third distance between the lower regions.

10. The light emitting device of claim 1, wherein the first bulk electrode and the second bulk electrode have a thickness approximately 5 to 20 times greater than the thickness of the first electrode and the second electrode, respectively.

11. The light emitting device of claim 1, further comprising:
    a first insulation layer covering a lower surface of the light emitting structure and lower and side surfaces of the second electrode, and disposed between the light emitting structure and the first electrode to insulate the first electrode from the second electrode.

12. The light emitting device of claim 1, further comprising a second insulation layer covering a portion of the first electrode.

13. The light emitting device of claim 1, wherein the substrate further comprises a base supporting the first interconnection portion and the second interconnection portion, the substrate including at least one via-hole formed through the base.

14. The light emitting device of claim 13, wherein via-holes are disposed on the first bulk electrode and the second bulk electrode, respectively.

15. The light emitting device of claim 13, wherein the at least one via-hole does not overlap the first bulk electrode and the second bulk electrode in the vertical direction.

16. The light emitting device of claim 1, wherein each of the first and second bulk electrodes comprises a monolithic layer.

17. The light emitting device of claim 1, further comprising:

solder material disposed between the first bulk electrode and the first interconnection portion and between the second bulk electrode and the second interconnection portion.

18. The light emitting device of claim 17, wherein the insulation support layer between the first and second bulk electrodes prevents the solder material from flowing between and disconnecting the bulk electrodes.

19. The light emitting device of claim 1, wherein the insulation support layer covers an outer side surface of the first bulk electrode and an outer side surface of the second bulk electrode.

20. The light emitting device of claim 19, wherein the insulation support layer comprises an insulating polymer, an insulating ceramic material, an epoxy molding compound, or a silicon (Si) resin.

* * * * *